(12) United States Patent
Allen

(10) Patent No.: US 9,160,294 B2
(45) Date of Patent: Oct. 13, 2015

(54) VIRTUAL PRE-AMPLIFIER AND EFFECTS SYSTEM AND METHODS FOR CUSTOMIZING AND USING THE SAME IN LIVE PERFORMANCES

(71) Applicant: Thomas Alexander Allen, Lincoln, AL (US)

(72) Inventor: Thomas Alexander Allen, Lincoln, AL (US)

( * ) Notice: Subject to any disclaimer, the term of this patent is extended or adjusted under 35 U.S.C. 154(b) by 312 days.

(21) Appl. No.: 13/785,499

(22) Filed: Mar. 5, 2013

(65) Prior Publication Data

US 2014/0254826 A1    Sep. 11, 2014

(51) Int. Cl.
*H03G 5/02*    (2006.01)
(52) U.S. Cl.
CPC ........................................ *H03G 5/02* (2013.01)
(58) Field of Classification Search
CPC ........................................................ H03G 5/02
USPC .................................... 381/61, 98, 119, 120
See application file for complete search history.

(56) References Cited

U.S. PATENT DOCUMENTS

| | | | | |
|---|---|---|---|---|
| 5,757,941 | A * | 5/1998 | McMillen | 381/119 |
| 6,664,460 | B1 * | 12/2003 | Pennock et al. | 84/662 |
| 8,180,073 | B1 * | 5/2012 | Grote | 381/119 |
| 2008/0240454 | A1 * | 10/2008 | Henderson | 381/61 |

* cited by examiner

*Primary Examiner* — Harry S Hong
(74) *Attorney, Agent, or Firm* — Parks Wood LLC; Mickki D. Murray, Esq.

(57) ABSTRACT

The technology in one embodiment includes an audio-processing unit, for processing an input audio signal using a pre-established audio feature. The unit includes a processor, an audio-device input in operative communication with the processor, and a system-user interface being in operative communication with the processor. The unit also includes a computer-readable medium being in operative communication with the processor and comprising a tone-manipulation component and computer-executable instructions that, when executed by the processor, cause the processor to perform various operations. The operations include presenting, using the system-user interface, a graphical-user-interface (GUI) display including an identifier associated with the tone-manipulation component, receiving, from the system-user interface, a user signal indicating a user selection of the tone-manipulation component from the GUI display, receiving the input audio signal from the audio-device input, and manipulating, using the tone-manipulation component, the input audio signal, yielding a manipulated signal.

20 Claims, 8 Drawing Sheets

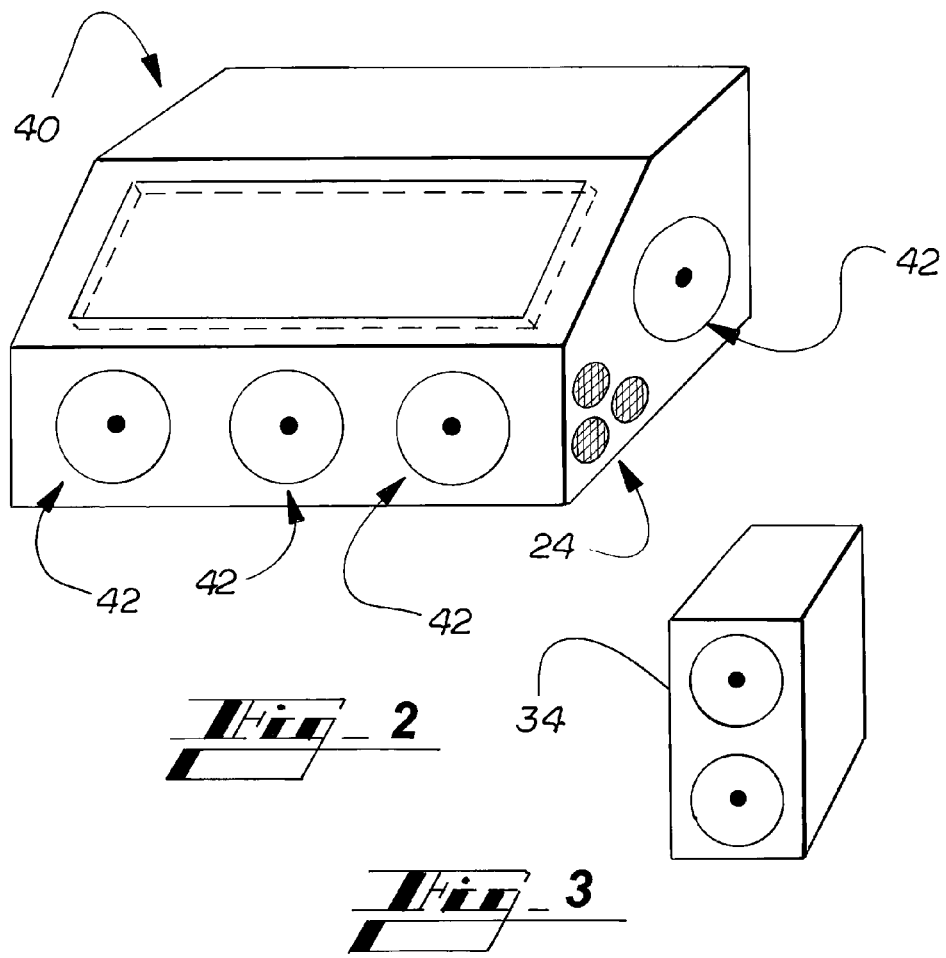
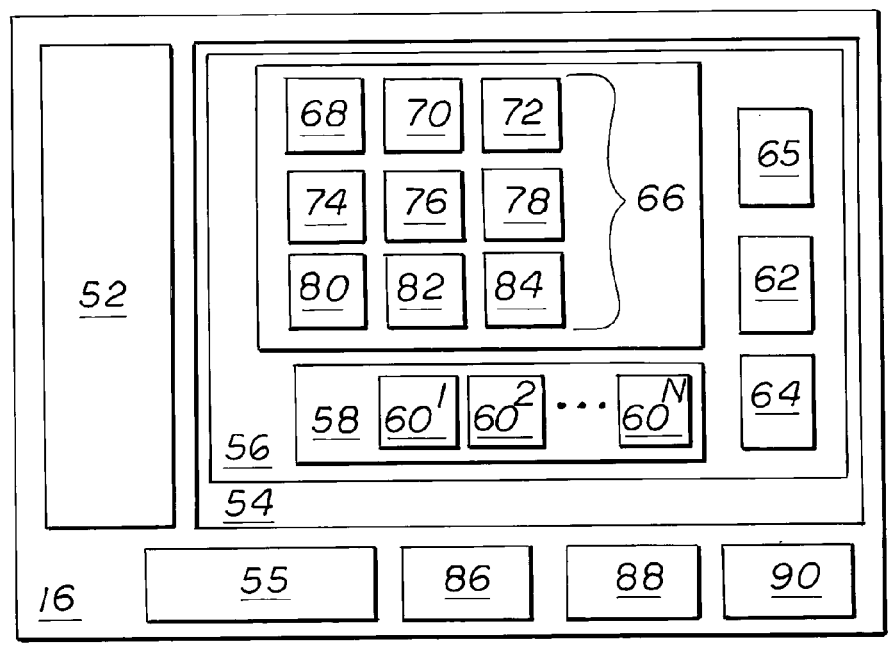

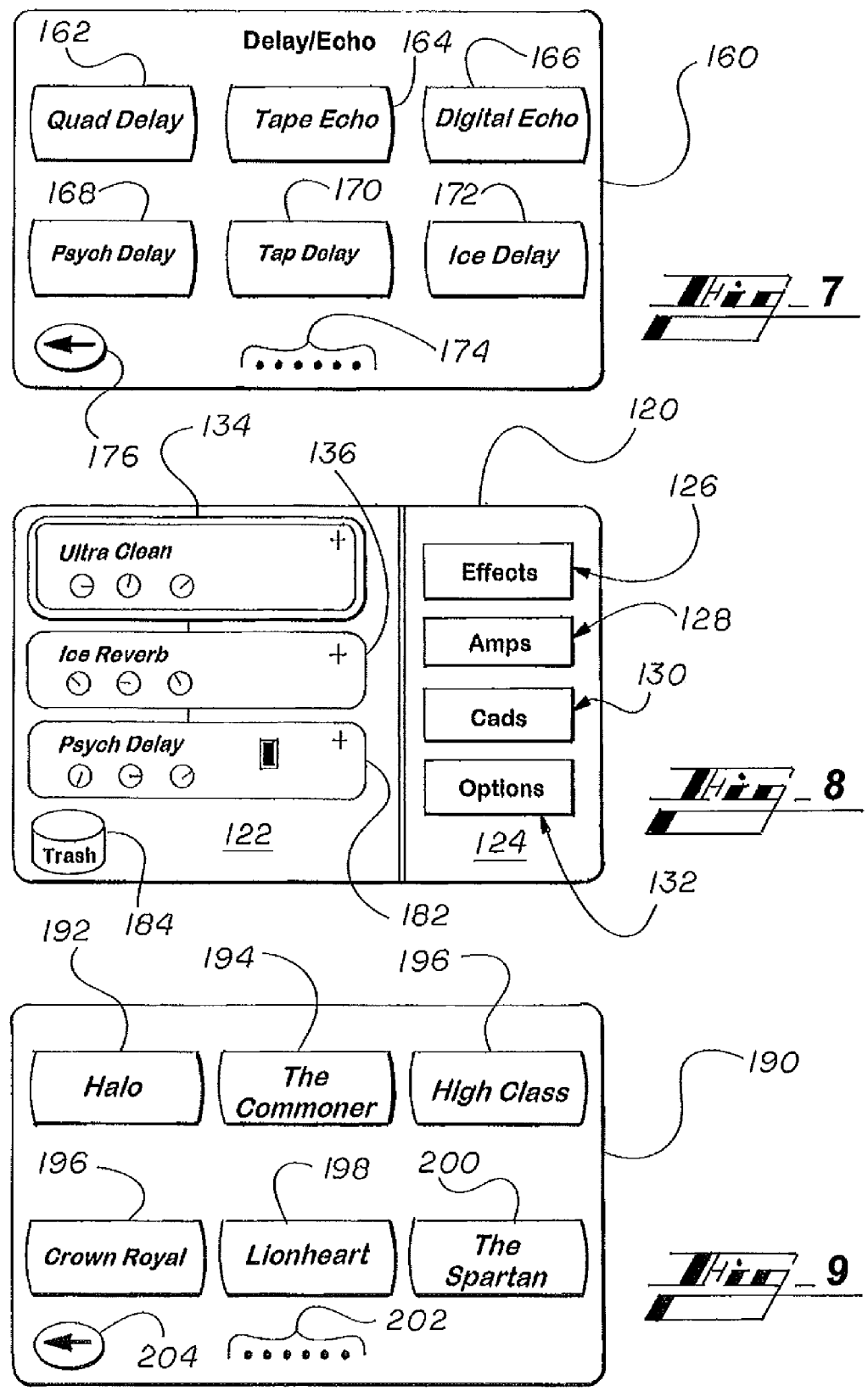

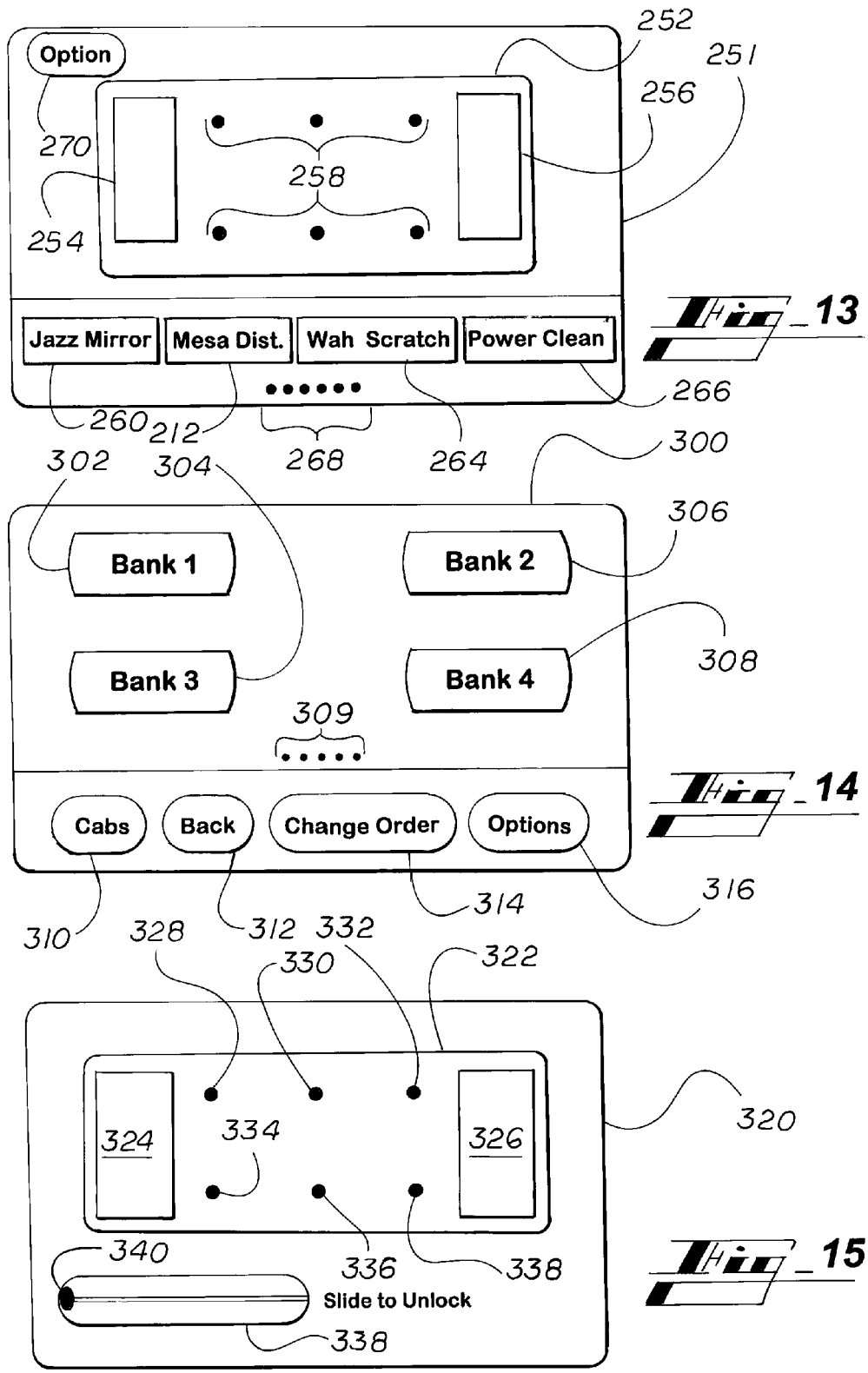

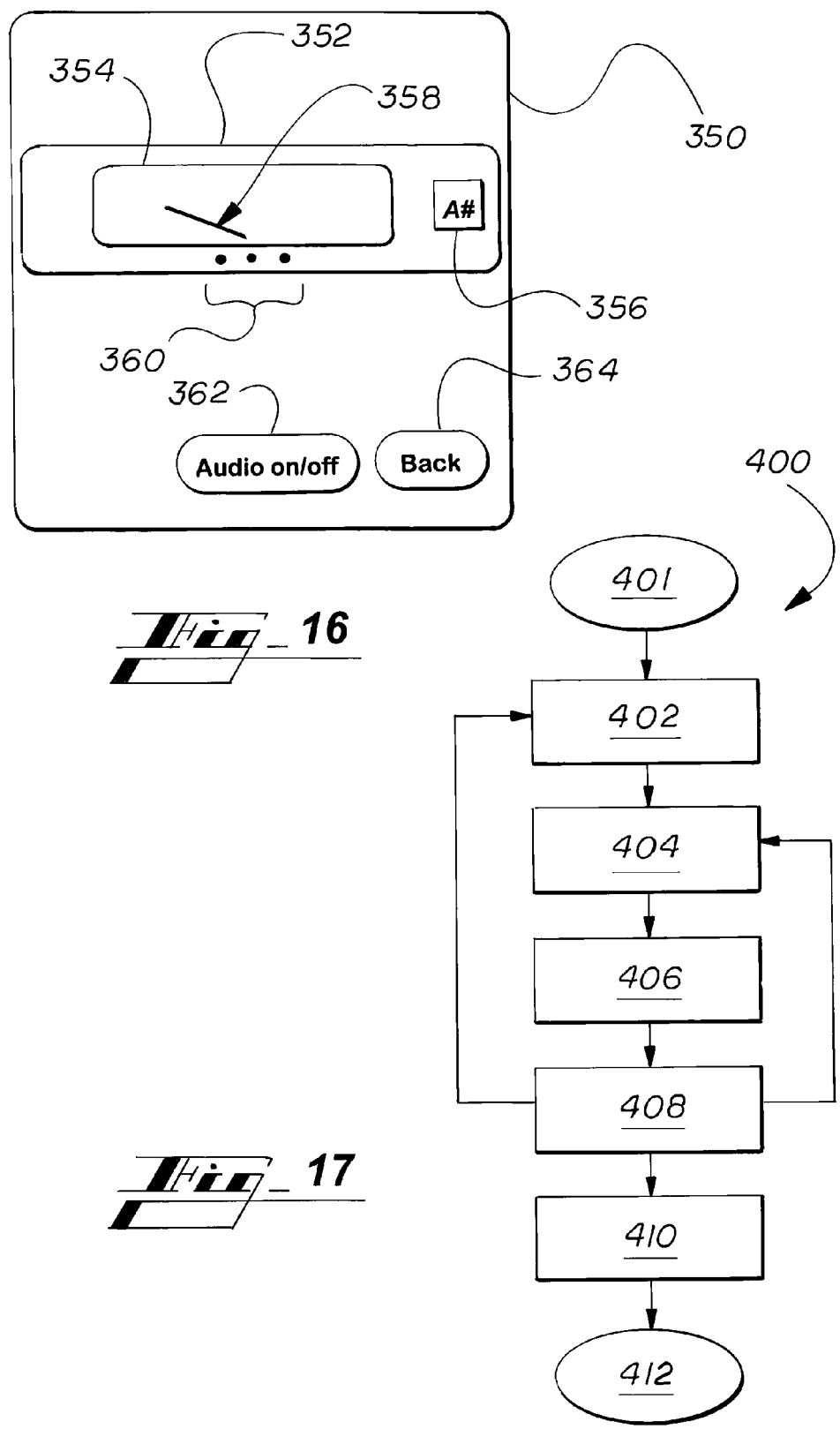

VIRTUAL PRE-AMPLIFIER AND EFFECTS SYSTEM AND METHODS FOR CUSTOMIZING AND USING THE SAME IN LIVE PERFORMANCES

TECHNICAL FIELD

The present disclosure relates to systems and methods for manipulating sound during live performances and, more particularly, to computerized systems and methods for creating and using one or more customized audio packages to manipulate sound during live musical performances.

BACKGROUND

Conventionally, musicians and supporting sound technicians or engineers need to adjust a multitude of audio-manipulation hardware devices to desired settings in advance of live performances. The hardware is often arranged in one or more racks, or stacks, and, depending on the sophistication of the performance, included tens or even hundreds of knobs, dials, sliders, buttons, switches, and/or other adjustable components. The conventional arrangement is undesirably fixed and inflexible in that it cannot be changed readily to accommodate situational needs.

Different sound settings are needed for different situations. The scenarios include different types of music, different songs within the same genre, the venue, generally, and day-of-performance dynamics of the venue. Further, regarding venues, different venues have different acoustical characteristics. Performance sound is affected in a relatively-small concert hall, for instance, differently than in a domed stadium, and further different than at an outdoor venue.

Regarding dynamics, output sound is affected differently in the same venue based on particular arrangements of the room on the day of the performance, including stage location, curtain placement, sitting versus standing audience, and size and density of the audience. Technicians and/or artists also need to check the many hardware settings before every performance, or between sets or even songs, which is very time and energy consuming. And even when set property, the hardware controls are often subsequently adjusted improperly or unintentionally in stage set-up or during the performance.

As another shortcoming, the large number of settings also increases the likelihood of errors and malfunction.

Artists are also limited traditionally by the particular hardware available to them. A guitarist, for example, having only a first type of pre-amplifier, or any sound hardware device, is of course limited to using that hardware. And even if the guitarist had access to two or more such sound hardware devices, it is cumbersome to move the devices and/or manually change connections at the devices or instruments, especially during the performance.

Present-day digital products focus on editing recorded music for playback, not live performance. Digital audio workstations, for example, allow only sound editing of digitally-recorded music for playback from a conventional compact disc or other music storage medium.

SUMMARY

The technology presented by the present disclosure solves the aforementioned shortcomings, providing systems and methods for creating and using one or more customized audio packages to manipulate sound during live musical performances.

A unit of the present technology includes a computer providing a wide variety of audio-manipulation functions that were not available before and only partially achievable only by using numerous distinct and expensive hardware devices.

The unit allows a user to develop a custom virtual pre-amplifier, and other virtual components such an effects rig, for carrying out operations equivalent to, and in addition to, numerous separate traditional hardware devices such as pre-amplifiers, post-gain or power amplifiers mixing boards, effect pedals, and others.

The present technology can create high-quality sound output using input from even a low-quality instrument. Signals from an old or low-quality keyboard, for instance, can be enriched for delivering world-class sound, without the high price of an expensive keyboard, pre-amplifier, effects rig, or other high-end hardware.

The present technology also provides a computerized solution allowing pre-establishing of live-performance audio packages customized to needs of a user such as a musician or other artist. The package is stored for later use at the same or similar venue, and can be adjusted via the interface prior to or during a performance. The technology allows use of one or more the pre-established software audio packages at will for performances by allowing the user to select them using a touch-sensitive system-user interface or a performance input device, or PID, such as a footboard or foot controller. The user and supporting staff are saved time and energy in preparing for and giving performances.

For creating or modifying the pre-established audio packages, the present technology also beneficially allows the user to select one or more pre-formed tone-manipulation components, such as plug-ins. Each tone-manipulation component can include one or more virtual versions of pre-amplifiers and other audio devices. The tone-manipulation components are custom-created by the user, a manufacturer of the technology, or a third party. And the third party tone-manipulation components, e.g., plug-ins, can be made available to the artist or sound engineer via an online marketplace dedicated to supporting the present technology.

As referenced above, the solution allows the user to associate the pre-established audio packages with buttons and/or pedals of a performance input device (PID), such as a footboard, for easy access and manipulation by the artist before and during the live performance.

By providing adjustable settings in a single computerized system, and thereby obviating the plethora of conventional hardware knobs, sliders, and buttons, the present system greatly decreases the likelihood of errors and malfunction associated with preparing for and putting on a live performance.

Select embodiments of the present disclosure are now described further. The descriptions include substance described above, sometimes using alternative terms or elaborating, and sometimes being broader in ways.

In one embodiment, the present technology includes, as shown in the first independent claim, below, an audio-processing unit, for processing an input audio signal using a pre-established audio feature. The unit includes a processor, an audio-device input in operative communication with the processor, and a system-user interface being in operative communication with the processor. The unit also includes a computer-readable medium being in operative communication with the processor and comprising a tone-manipulation component and computer-executable instructions that, when executed by the processor, cause the processor to perform various operations. The operations include presenting, using the system-user interface, a graphical-user-interface (GUI)

display including an identifier associated with the tone-manipulation component, receiving, from the system-user interface, a user signal indicating a user selection of the tone-manipulation component from the GUI display, receiving the input audio signal from the audio-device input, and manipulating, using the tone-manipulation component, the input audio signal, yielding a manipulated signal.

As shown below in the second independent claim, in one embodiment the technology includes a tangible computer-readable storage device having computer-executable instructions comprising a live-performance module that, when executed by a computer processor, causes the computer processor to perform live-performance various operations. The operations include presenting, via a graphical-user-interface (GUI) display, visual information indicating, directly or indirectly, a pre-established audio package comprising a particular tone-manipulation component. The operations also include receiving, in response to presenting the visual information, user input indicating the pre-established audio package or a bank of which the pre-established audio package is a member. The operations further include retrieving, in response to the user input, the pre-established audio package or the bank of which the package is a member, receiving a live input audio signal, and manipulating, using the particular tone-manipulation component of the pre-established audio package retrieved, the live input audio signal, yielding a manipulated signal.

As shown below in the third listed independent claim, in one embodiment the technology includes a tangible computer-readable storage device having computer-executable instructions, for facilitating creation or modification of a pre-established audio package and use of the package to manipulate, during live performance, audio input, comprising a laboratory module that, when executed by a computer processor, causes the computer processor to perform lab operations. The lab operations include presenting, via a system-user interface, an audio package area for use in creating or modifying the pre-established audio package. The lab operations also include receiving, in response to presenting the audio package area, first user inputs indicating a plurality of pre-established tone-manipulation components for inclusion in the pre-established audio package, wherein each of the plurality of pre-established tone-manipulation components is obtained by a manner selected from a group of manners consisting of (a) retrieval, via a wide area computer network, from a tone-manipulation component market and (b) retrieval from a tone-manipulation component storage area of the tangible computer-readable storage device. The lab operations further include establishing the pre-established audio package to include the plurality of pre-established tone-manipulation components indicated by the first user inputs. The lab operations still further include presenting the audio package area, populated with the pre-established audio package, to allow a user of the device to adjust settings of the package. The lab operations yet further include receiving, via the system-user interface, second user input requesting adjustment of one of the pre-established tone-manipulation components, yielding a customized pre-established audio package. The lab operations also include storing, the customized pre-established audio package, for later use by the processor to manipulate the audio input during the live performance.

These and other aspects of the present technology will be in part described below and in part apparent to one having ordinary skill in the art based on the descriptions herein.

DESCRIPTION OF THE DRAWINGS

FIG. 2 illustrates schematically a second example system, including an integral output component.

FIG. 3 illustrates schematically example details of the computing unit of FIGS. 1 and 2.

FIGS. 5-12 illustrate various example laboratory-mode screens.

FIG. 13 illustrates an example bank-mode screen.

FIGS. 14 and 15 show example stage-mode screens.

FIG. 16 illustrates an example tuner-mode screen.

FIG. 17 illustrates a first example process algorithm according to the present technology.

DETAILED DESCRIPTION

As required, detailed embodiments of the present disclosure are disclosed herein. The disclosed embodiments are merely examples that may be embodied in various and alternative forms, and combinations thereof. As used herein, for example, "exemplary," and similar terms, refer expansively to embodiments that serve as an illustration, specimen, model, or pattern.

The figures are not necessarily to scale and some features may be exaggerated or minimized, such as to show details of particular components. In some instances, well-known components, systems, materials or methods have not been described in detail in order to avoid obscuring the present disclosure. Therefore, specific structural and functional details disclosed herein are not to be interpreted as limiting, but merely as a basis for the claims and as a representative basis for teaching one skilled in the art to employ the present disclosure.

I. Synopsis

In various embodiments, the present disclosure describes functions and computerized systems, including devices, units, and constituent components for performing the functions. The functions include manipulating audio, such as audio from musical instruments, during a live performance. While described mostly herein in connection with live performances using musical instruments, such as electronic guitar, bass, keyboard, and drum instruments, the technology can also be used in connection with other audio inputs, such as audio from a microphone during the live performance.

The functions allow user creation and customization, prior to or during a live performance, of live-performance audio packages. The pre-established audio packages, or PEAPs, are implemented by the computerized system for performance responsive to input at its touch-sensitive user interface.

The system stores the pre-established packages for later use. The artist can use the stored package at a previously-used venue or similar venue, for example, saving the artist and support team time and energy in preparing for and giving performances.

Creating and customizing the pre-established audio packages includes receiving user selection from amongst multiple pre-formed components, which can be referred to as tone-manipulation components, or TMCs, such as plug-ins. Each TMC can include a virtual version of a pre-amplifier, an effects rig, a sound cabinet, or other hardware and/or software sound devices.

The TMC, or virtual hardware, can be custom-created by the user, a manufacturer of the technology, or a third party. TMCs can be made available to the artist or audio engineer via an online marketplace dedicated to supporting use of user-systems of the present technology.

The system and/or parts thereof can be referred to by any of a wide variety of descriptive or other names.

Figure 1:
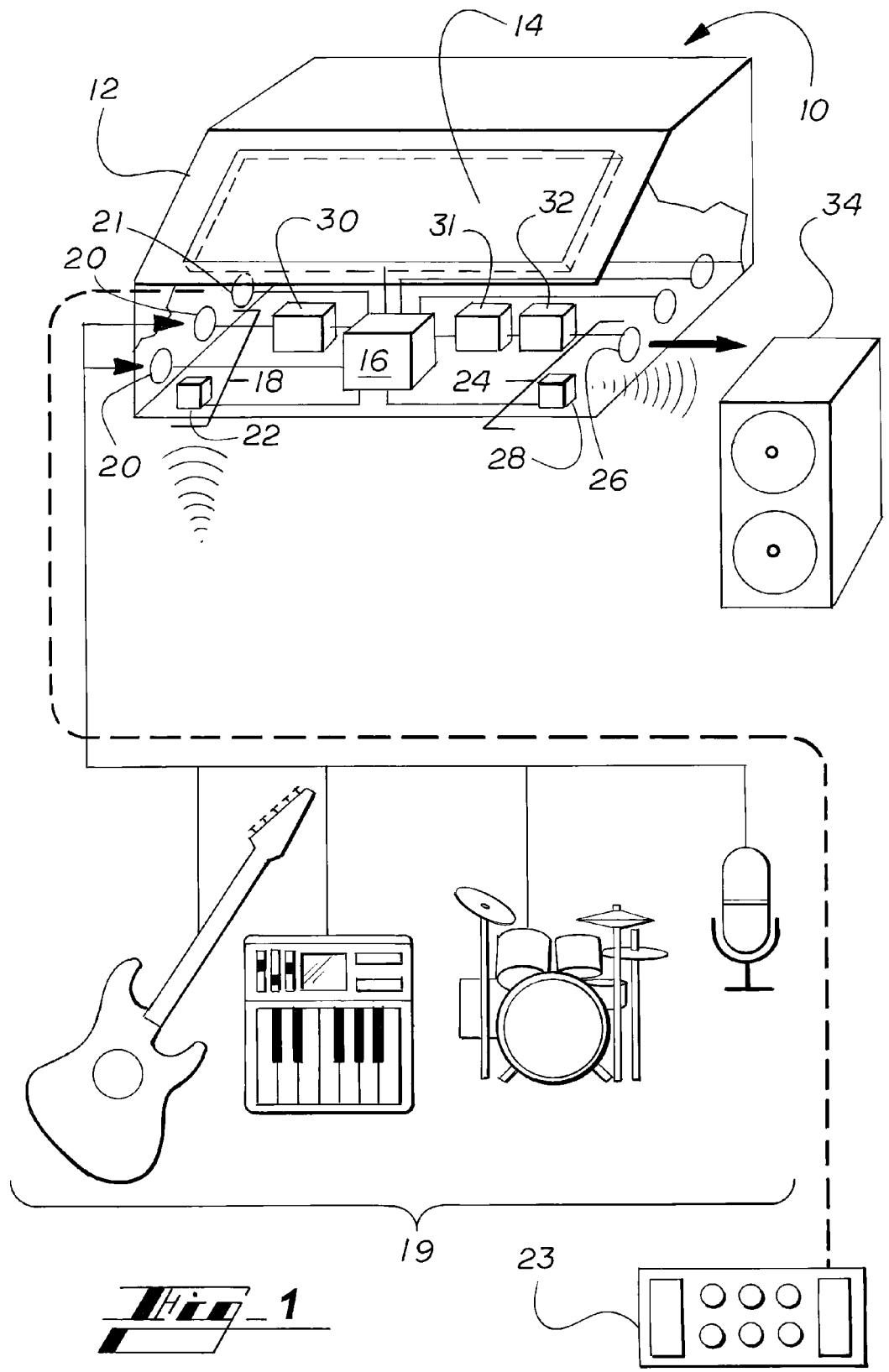
FIG. 1 illustrates schematically a first example system including a system body, a screen interface, an input interface, a computing unit, and an output interface.

II. System Overview (FIG. 1)

The present technology includes numerous components configured to perform the functions and beneficial goals associated therewith. Turning now to the figures, and more particularly to the first figure, FIG. 1 shows an exemplary system indicated therein by reference numeral 10. Parts of the system are shown schematically. The system 10 includes a body 12, which can also be referred to as a casing, a shell, a housing, or the like. In one embodiment, the body 12 has a width, extending generally from left to right in FIG. 1, between about sixteen inches and about twenty inches, a height of between about four inches and about seven inches, and a depth, measured between fore and aft in FIG. 1, of between about seven inches and about eight inches. The body 12 can have other dimensions without departing from the scope of the present technology. These example dimension ranges represent only some contemplated embodiments, and sizes can vary, such as depending on needs of the instrument and/or the engineer or end user. The sizes can vary, e.g., by being slightly or greatly larger or small in any dimension.

The system 10 also includes a system-user interface 14. The system-user interface can be referred to in other ways, such as a user interface, SUI, or just UI. In one embodiment, the SUI 14 has a width of between about twelve inches and about fifteen inches, and a height of between about eight inches and about ten inches. The SUI 14 can have other dimensions without departing from the scope of the present technology.

The user interface 14 is, in one embodiment, preferably a touch-sensitive screen. While referred to generally as being touch-sensitive, herein, the user interface 14 can have any of various configurations facilitating communication, between the system 10 and a user of the system 10, without departing from the scope of the present technology. Example touch-sensitive interactive technologies include resistive-touch screens, and capacitive-touch screens.

Other interactive technologies that the interface 14 can have include those using projected capacitance, infrared detection or recognition, optical wave detection, dispersive signal detection, and acoustic pulse detection. In a contemplated embodiment, the display provides a holographic image and user input can be detected using at least one sensor, such as a camera-based sensor.

The user interface 14 is configured to display or cause display of information to the user of the system 10. The information, such as text, symbols, and other graphics, can be displayed, for example, via a graphical-user-interface (GUI) display.

Configuration and function of the user interface 14 is described further below in connection with other components of the system 10 and associated functions.

With continued reference to FIG. 1, the system 10 is shown to also include a computer sub-system 16. The term computer sub-system is used for descriptive purposes, and the computer sub-system 16 can be referred to by other names such as a computer-processing unit, a computing device, a computer module, simply a computer, or the like, without departing from the scope of the present invention. The sub-system 16 comprises computing components including a processor and a memory storing code for execution by the processor, as described further below in connection with FIG. 2.

The system 10 also includes one or more audio-input interfaces 18 for receiving audio input at the system 10. The audio-input interfaces 18 can also be referred to as a sound input, or just an input, for example. Audio signals are received at eh inputs 18 from audio devices 19, such as electric guitars, electronic keyboards, electric drums, electric basses, and microphones. The system 10 can be configured to receive analog and/or digital-type audio signals.

Analog signals are transmitted, for example, by instruments like electric guitars lacking digital pick-ups, and by microphones. Digital signals, such as musical input digital interface (or MIDI) signals, are received from instruments like electronic keyboards. Digital signals are also received from instruments or other devices equipped with a digital pickup, MIDI pickup.

The digital signal includes data advising the receiving device, e.g., the system 10, on how to generate a desired output signal. For instance, if a keyboard is set to piano mode, the digital signal advises the system 10 to output a piano sound. If the keyboard is set to violin mode, the digital signal advises the system 10 to output a violin sound. Analog signals include the tone, or at least an indication of the tone.

In order for the system 10 to digitally manipulate the analog input signal, the signal is converted to a digital signal for creating a desired output analog signal, manipulated, and then converted back to a corresponding analog signal. The resulting analog signal is output to an output component (e.g., component 34 of FIG. 1).

When a digital signal is received at the system, the signal is manipulated according to the present technology, then converted to an analog signal for output to an output component.

The audio-input interfaces 18 comprise wired-based and/or wireless-based interfaces. Wired interfaces include a physical connection point, indicated by reference numeral 20 in FIG. 1. Wireless interfaces include a receiver, indicated by reference numeral 22. The audio-input interfaces 18 can be configured to receive analog and/or digital audio-related signal. The interfaces 18 can include at least one musical input digital interface (or MIDI).

A wireless receiver 22 can be implemented structurally as a receiver or a transceiver capable of transmitting audio signals or other data in addition to receiving audio-input signals. The transmissions can include control or other message data for receipt by instruments or other devices peripheral to the system 10.

For embodiments in which the receiver 22 is a transceiver, the transceiver can be the same or different than a transceiver associated with a wireless-based audio-output interface 28, described below in connection with providing system output to an output component (e.g., speaker).

The wireless audio-input interface 22 can be configured and operate according to any one or more of a variety of wireless-communication protocols. Example protocols include short-range protocols such as wireless fidelity, or WI-FI, and BLUETOOTH (WI-FI and BLUETOOTH are registered trademarks of Wireless Ethernet Compatibility Alliance, Inc., of Austin, Tex. and Bluetooth Sig, Inc., of Kirkland, Wash., respectively). The interface 22 can also or instead be configured to communicate via long-range transmissions such as cellular or satellite transmissions.

Each audio-input interface 18, whether wired and/or wireless-based, can be controlled in part or entirely by the computer sub-system 16 for receiving and/or sending data from/to peripheral devices. The peripheral devices can include instruments and speakers, as mentioned, and also other remote computing devices like a remote server or database, or a computer located at a performance venue, such as a computerized performance-management system, which may also control lighting, curtain timing, or other aspects of a live performance.

The audio-input interfaces 18 are in operative communication with the computer sub-system 16. The operative communication can be based on hardwiring and/or wireless communications between the interfaces 8 and the computer 16.

The system 10 can also include any other inputs pertinent to performance of the functions described herein. For instance, an auxiliary input interface 21, or just auxiliary input, can include connections for power cords, removable storage devices, etc. Common components such as a battery are not shown to simplify the disclosure including the figures.

As another example, the auxiliary input 21 can include a connection point for connecting a performance input device (PID), such as a footboard or foot controller, by which a user can make selections amongst pre-established packages, tone-manipulation components (TMCs) of a package, or expressible aspects of a TMC, stored at the system 10, based on pre-associations made between the PID parts and package features, as described further below, A foot controller is represented in FIG. 1 by reference numeral 23. The footboard 23 can also communicate with the system 10 wirelessly, such as via the receiver/transceiver 22. Musicians use footboards during live performance to make shifts or changes, such as for switching from one type of tone setting to another tone setting, without having to use their hands.

An example footboard is a FCB1010 foot controller provided by the Behringer company. Interoperation between the system 10 and footboards is described further below.

As provided, the system 10 also includes one or more audio-output interfaces 24. Like the audio-input interfaces 18, the audio-output interface 24 can include wired output interfaces 26 and/or wireless-based interfaces 28. Wireless audio-output interfaces 28 include a transmitter, which can also be implemented as a transceiver, and so capable also of receiving data for the system 10.

In some embodiments, the system 10 includes one or more signal-processing components 30, 31. The components can include an analog-to-digital (A/D) converter, or ADC, and a digital-to-analog (D/A) converter, or DAC.

While the signal-processing components 30, 31 and other parts of the system—e.g., receiver/transceiver 22 and transmitter/transceiver 28—are shown separate from the computer sub-system 16, any one or more components of the system 10 can be a part of and performed at the computer sub-system 16 without departing from the scope of the present technology.

The A/D converter is used to translate analog signals, such as from an acoustical guitar, not having a digital pick-up, or a microphone, to digital signals. The computer sub-system 16 processes the resulting digital signal. If analog output is required, such as for sending output to a speaker, the D/A converter translates the processed digital signal to analog.

In one embodiment, software of the system 10 (e.g., the computer-executable instructions 56 of FIG. 3) includes an analog-to-digital converter, or a virtual digital pickup. A virtual pickup can operate like, or at least produce output like that of, a conventional digital pickup used in connection with instruments such as guitars.

Other conventional signal-processing components 30 include, for example, filtering components, and Fourier or other transform components. The system 10 also includes a post-gain amplifier 32, which may be referred to as a power amplifier, a hardware power amp, or the like. The power amplifier 32 boosts, or provides a gain to, output analog signals before they are provided to an output component 34 such as a speaker.

The output component 34 is shown connected by wire to a wired output-audio interface 26. The speaker can, instead, include a receiver, or transceiver for receiving wireless output sent by a wireless output-audio interface 28 of the system 10.

Any or all of the components of the system 10 described herein can be integral to a unitary apparatus, or unit. In some embodiments, the system is not completely unitary in that while most components are part of a primary unit, at least one of the components is separate from the unit. The at least one component is in operative communication with the unit by wire or wirelessly.

As described next in connection with FIG. 2, for instance, the system 10 can be partially unitary, being unitary with respect to integral components including the computer sub-system 16, the power amplifier, and at least one output component 42, while also including a separate output component 34.

III. Integral Output Device (FIG. 2)

FIG. 2 shows an embodiment of a system 40, like the system 10 of FIG. 1, having one or more of the output devices 42 as a part of the system 40. Particularly, as shown, the system 40 can include an integral output device 42 in the form of a speaker.

While the system 40 according to this embodiment includes an integral output device 42, the system 40 can also be connected by wire or configured to communicate wirelessly with an output device 34 external to the system 40.

Having an output component 42 integral to the system 40 has benefits including the system 40 being more self-contained. A musician or other performer on the go can more easily transport, set up, and use a system 40 having one, or at least less primary components.

On the other hand, having an output component 34 separate from, and for operative communication with, the system 10/40, could have a benefit of allowing for easier changing of the output 34, such as if an upgraded speaker was desired or a speaker needed maintenance.

For improved flexibility of the in-system arrangement, the system 40 and the integral output component 42 are in one contemplated embodiment configured specially for easy removal and replacement of the component 42. For instance, various types of speakers specific for use with the present system 40 can be made available having a snap, magnet, clip, screw, or other releasable or easily connected/disconnected connection mechanism.

For efficiency and simplicity, every interconnection between components of the systems 10, 40 of FIGS. 1 and 2 is not necessarily shown, and such connections are considered disclosed and shown inferentially to the extent consistent with performance of the functions described herein.

The system 40 described in connection with FIG. 2 can otherwise by the same as the system 10 described in connection with FIG. 1.

IV. Computer Sub-System (FIG. 3)

FIG. 3 shows schematically exemplary details of the computer sub-system 16 described above in connection with FIGS. 1 and 2. The computer sub-system 16 includes a computer processor 52 and a computer-readable device 54, medium, or memory. The computer-readable device 54 can be tangible and can be non-transitory.

The computer-readable device 54 includes computer-executable instructions 56 that, when executed by the processor 52, cause the processor to perform any of the various operations of the present technology described herein.

The computer-readable device 54 and the processor are connected by a data connection structure 55. The data connection structure 55 shown schematically can be a traditional type of data bus and/or represent another type of data connection such as wireless communication components—e.g., respective receivers, transmitters, and/or transceivers.

In addition to the computer-executable instructions 56, or as parts thereof, the storage device 54 can include a tone manipulation component (e.g., plug-in) portion 58 storing one or more audio-manipulating audio manipulation components 60 (e.g., plug-ins). FIG. 3 shows schematically a first audio manipulation component $60^1$, a second audio manipulation component $60^2$, and on as the system 10 can include any number (N) of audio manipulation components $60^N$, limited only by the amount of storage provided.

Reference numeral 65 represents the virtual digital pick-up, or the in-software ADC, described above. The virtual digital pick-up can be a type of MIDI pick-up which generates an output audio signal based on the input MIDI signal. For instance, if an input MIDI signal is received from an electronic keyboard, wherein the signal indicates that the keyboard is set to a violin mode, then the MIDI component 65 would process the signal to generate a resulting violin-sound keyboard signal. The resulting signal would also be generated according to any other requirements of the input MIDI signal, such as the note, and perhaps volume.

The storage device 54 can also include other data supporting and facilitating the functions described herein. Example other data includes user preferences or settings 62, and other system data 64.

Portions or all of the computer-executable instructions 56 can be divided into code modules 66 according to respective functions, or operations, that they perform. The code modules 66 can, but need not, be referred to according to their respective functions.

For instance, a code module having instructions causing the processor 52 to design or customize a pre-established audio package according to the present technology, can be referred to as a design module. Or, because the designing or modifying can be considered to be performed in a laboratory environment, the module can be referred to as a laboratory or lab module. Corresponding operations of the lab module can be referenced, similarly, as design operations, processes, steps, or functions, laboratory operations, lab operations, or similar. The same applies similarly to other functions and operations described herein (e.g., bank operations, processes, steps, or functions, and stage operations or functions).

Other code modules 66 can be referenced similarly according to the functions they perform, and the particular functions, or operations, can be referred to likewise. On the other hand, modules can be referred to herein more generically, such as, for example, as first, second, third modules, or similar.

Any two or more modules described herein can be encompassed in and/or referred to as one module. Thus, five modules can be combined, by function, structure, and/or nomenclature, into two or even one module, for example. Similarly, any one module described herein can be separated in terms of function, structure, and/or nomenclature into two or more modules.

As example modules 66, those shown in FIG. 3 can be considered to include a graphical-user-interface (GUI) module 68, a home-screen module 70, the laboratory module 72, a bank or storage module 74, a performance or stage module 76, a tuner module 78, a market module 80, a preferences or settings module 82, and a help or information module 84.

The GUI module 68 can be focused on generation and management of a graphical-user-interface (GUI) display. The GUI, whether presented by the GUI module 68 and/or another module, is a visual interface, presented via the system-user interface 14 by the processor 52, for providing information to and receiving information from the user with respect to operations of the other modules 66.

For performing the functions described herein, the computer sub-system 16 can also have other computing components, including any type of input component 86—e.g., wired or wireless-based, any type of output component 88, and other ancillary computing parts 90, such as batteries, peripherals including cameras, microphones, back-up storage, removable storage, etc.

Functions of the present technology, including operations performed by the processor 52 executing the computer-executable instructions 56, are described further below in connection with the respective code modules 66.

Figure 4:
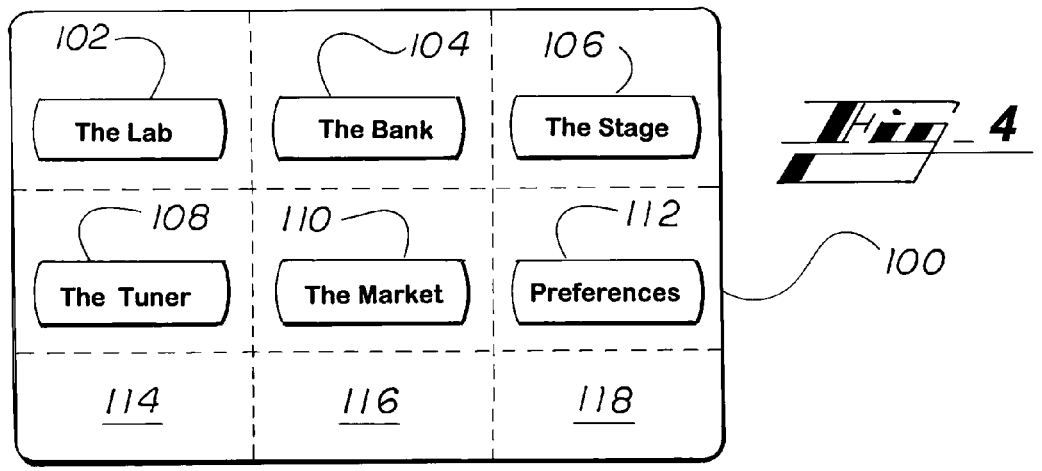
FIG. 4 illustrates an example home screen of a graphical-user interface.

V. Graphical-User Interface Display (FIG. 4)

As referenced above, the computer-executable instructions 56 (FIG. 3) include code for presenting a graphical-user-interface (GUI) display to the user(s), such as musicians, other performers and artists, and their support team including stage hands, technicians, and audio engineers.

The GUI display operates to provide information to the user(s) and receive information from the user. As will be described below in connection with example screen shots and supporting operational algorithms, including flow-chart representations, the information provided to the user advises them of various options they have for customizing tone-manipulation functions.

Information received from the user includes selections for creating pre-established audio packages, storing the packages, and later modifying the packages.

At least one of the software modules 66 (FIG. 3) manages and controls operation of the graphical-user interface (GUI) display, including output to and receipt of input from, the GUI display.

As provided, functions of any two or more modules described herein can be functionally, structurally, and/or nominally combined into one, and vice versa. For instance, the information or help module 84 can be a part of the preferences or setting module 82.

FIG. 4 shows an example screen shot of a home screen 100 of the GUI display. In a first embodiment, a graphical-user interface module 68 manages and controls operations related to every screen presented by way of the GUI display. In second of these two embodiments, separate modules of the instructions 56 manage and control operations related to respective screens. Although, the functions of the present technology are described primarily herein with reference to the second embodiment, description of the same functions in the context of the first embodiment is considered disclosed in the descriptions as well.

Figure 5:
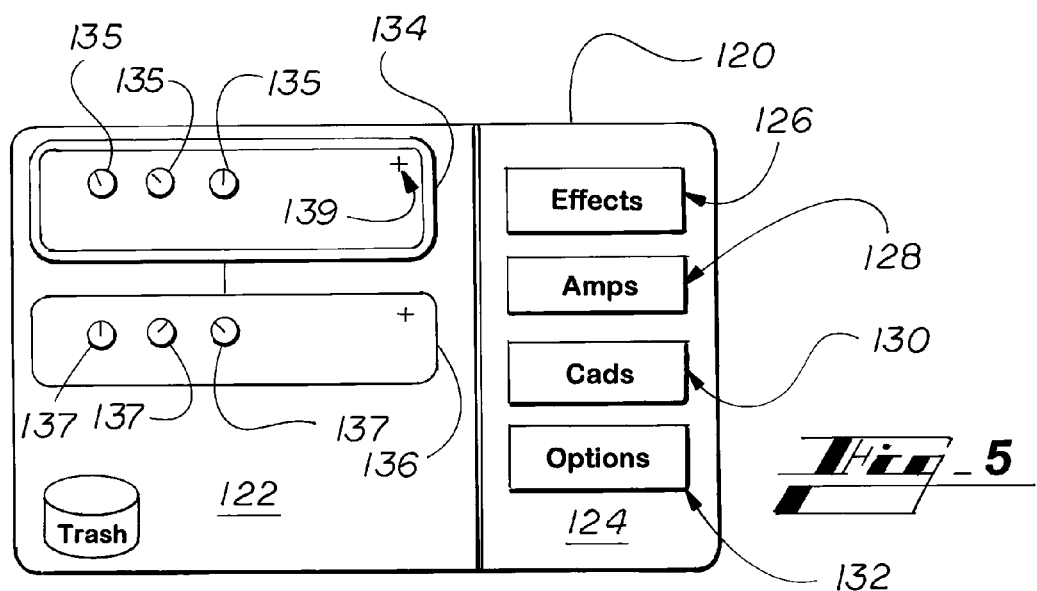

Thus, while the control and management of the home screen 100 of FIG. 4 and the laboratory screens of FIG. 5 and seq. are described primarily in connection with a home screen module 70 and lab module 72, respectively, the screens can be controlled and managed by a single module, such as the afore-mentioned graphical-user interface module 68. Further, multiple modules can work together to perform any function described herein. For instance, the graphical-user interface module 68 can operate in conjunction with a home screen module 70 regarding operation of the home screen 100, in conjunction with the lab module in connection with operation of the laboratory screens, etc.

The home screen 100 of FIG. 4 and all example screen shots of the figures are presented for illustration purposes. The screens may, for example, have other dimensions, icons, text, content, and arrangement than shown without departing from the scope of the present invention.

All display content, including icons, text, and other items, presented to the user can be referred to generally, in the specification and claims, such as information, data, content, or the like. Distinctions between various content, and various user input, can be referenced generally as well. In the claims, for example, the home screen presented, or an aspect (e.g., icon) thereof, can be referred to as first information presented, or first content presented. A user selection of an item of the first information can be referred to as a first user input. The screen displayed subsequently, in response to the first user input, such as a laboratory base screen (FIG. 5) can then be referred to generally as second information and the next user input as second user input, and so on.

The home screen 100 includes visual representations, or indications, such as icons, indicating selectable options for the user(s). Although, the option indications are referred to primarily herein as icons, the terminology is not presented in a limiting sense, as the indications can be other than icons or include non-icons and icons. The indications can include drop-down menus, radio buttons, slides, switches, and any other common graphical representation of information or selectable options or links. For example, multiple of the displayed icons can be represented by a single pull down menu whereby the multiple icons are displayed and selectable upon pull down of the menu The representations of the example home screen of FIG. 4 indicate multiple sub-sets of the GUI display. As provided, each can be associated with one or more controlling code modules. The representations illustrated in FIG. 4 include a laboratory or lab icon 102, a bank or storage icon 104, a stage or performance icon 106, a tuner icon 108, a store or market icon 110, and a preferences icon 112.

An information or help icon corresponding to the aforementioned information or help module 84 is not shown in FIG. 4, but such icon can be present on the home screen 100. The information and help screens are in one embodiment found in the preferences section. For descriptions purposes, information or help-related functions will be described below in connection with the preferences icon 82.

The home screen 100 can include less or more icons or information. For instance, the lower panels 114, 116, 118 in the screen shot 100 of FIG. 4 can include other icons or information. Example information can include an indication of the maker or distributor of the system 10, an indication of an user or account holder using the system 10 (e.g., name of person or entity), a date and time field, an on/off/sleep option, etc. Other panels can be added and the format is not limited to panels.

In response to user selection of an icon 102-112, a corresponding user-input signal (e.g., a first user input signal) is provided, by the touch-sensitive screen 14, to the processor 52 (FIG. 1). The user-input signal indicates the selection made by the user via the interface. The processor 52, executing the computer-executable instructions 56—e.g., a GUI or home screen module thereof, interprets the user-input signal and proceeds accordingly.

VI. The Laboratory (FIGS. 5-13)

In response to receiving a signal from the system-user interface 14, such as in connection with display of the home screen 100, indicating that the lab icon 102 was selected, the processor 52 proceeds to access the portion of the computer-executable instructions 56 corresponding to the laboratory functions—e.g., the lab module 72 and/or the GUI module 68.

FIG. 5 shows an example working screen 120 of what can be referred to as the laboratory. The laboratory is configured to facilitated user creation and/or modification of pre-established audio packages. Each package, which includes one or more of a wide variety of audio effects, can also be referred to simply as a tone.

The lab working screen 120 includes a display area 122 for showing currently-selected aspects of the pre-established audio package, or tone. The display area 122 can also be referred to as a tone-assembly area, package-assembly area, tone-display area, or package-display area, or the like.

The lab working screen 120 also includes a tone-selection section 124. The tone-selection section 124 includes indications of various audio or tone features that can be selected via the interface 14 by a user for inclusion in a package, and so for display in the package-display area 122 representing the package.

The audio or tone features shown in FIG. 5 by way of example are grouped as effects 126, amplifiers or amps, 128, speaker cabinets or cabs 130, and other options 132. The tone-selection section 124 can include less or more tone or audio feature groups without departing from the scope of the present technology.

Upon selection by the user of one of the group indications 126-132, the processor 52, responsive to receiving from the interface 14 a signal corresponding to the selection, proceeds to invoke corresponding portions of the computer-executable instructions 56, e.g., another part of the lab module 72. In doing so, the processor 52 then displays an appropriate subsequent screen for allowing the user to select, for including in the package, tone features under the audio feature group selected. The subsequent screens are described further below in connection with FIGS. 6, 7, 9, 10, 12, and 13. As described further below, FIGS. 8 and 11 show various lab home screens 120 following updates initiated by the user.

In the example of FIG. 5, aspects, or tone features, of the pre-established audio package have already been selected. Namely, a virtual pre-amplifier 134 has been selected and a virtual audio effect 136. A designer or user of the system 10, or a designer of just the audio feature, can designate names, colors, fonts, logos, and the like, to be associated with the various virtual audio features available.

In the example of FIG. 5, the particular pre-amp 134 and effect 136 are dubbed Ultra-Clean and Ice Reverb, as illustrated. As example colors, the Ice Reverb effect can be a light or cool blue color, and the Ultra Clean amplifier can be a color like grey or white.

In one embodiment, a developer could create their own virtual amps, effects, etc. by writing computer-executable code based on a plug-in library (such as LV2, VST, AU, etc.), They could do this from their computer using software-development tools mixed with the chosen plug-in standard API, or, e.g., LV2 standard. When they have a finished product, they could go to the website hosted in connection with the present system, upload their creation, and set it up to appear in the market described herein, Later, a customer can accesses the market (e.g., via the internet) and choose to download the created virtual amp, effect, etc. In one embodiment, a download action at the local system will send the virtual amp or effect, etc., to the same folder(s) as the other amps, effects, etc. that may already be located at the local system. In one embodiment, the items (e.g., amps, effects, etc.) are arranged in a pre-determined order, such as alphabetical order. The user can, then, simply go to the Lab, described herein, access the amp section (or effect, etc.) and see the downloaded feature, adjacent like features, for their selective choosing.

In one embodiment, the package-display area 122 is arranged so that each type of tone feature—e.g., pre-amp, effect, cab, and other options—is presented in the area in a pre-determined order. In the Example of FIGS. 5, 8, and 11, the pre-determined order places a virtual speaker cabinet, if any be selected, first vertically at the top.

A virtual cabinet is not selected for the package at the time of the screen shots of FIGS. 5 and 8, but one is selected before display of the screen of FIG. 11. The cabinet 232 in FIG. 11, named Lionheart as an example, is shown at the top of the vertical representation of the package in the package-display area 122. More particularly, the package-display area 122 can be arranged so that the cabinet icon, if a virtual cabinet is selected, is positioned against the very top edge of the package-display area 122, as shown for the cabinet 232 in FIG. 11.

According to the example arrangement of FIGS. 5, 8, and 11, if any virtual pre-amplifier be selected, they are positioned toward the top of the package-display area 122, beneath any selected virtual cabinet. In FIG. 5, for instance, the exemplary "Ultra Clean" pre-amp 134 is shown first because no cabinet is selected for the audio package up to the point in time at which the screen shot of FIG. 5 is taken.

In one embodiment, the software 56 is configured to allow the user to rearrange the icons in the package-display area, such as by allowing the user to simply drag a feature up or down. In a contemplated embodiment, the screen includes a move icon (not shown), allowing a user to tap the feature to be moved and then the move option icon, or tap the move icon and then the feature, and then either drag the feature to the new location or just tap the new location (e.g., just below or below another feature). The move icon could include, for instance, a move icon like those traditionally used including four arrows pointing away from a center point at right angles to each other Each tone feature can have one or more adjustments 135, 137, as shown in FIG. 5. The software 56, e.g., the lab module 76, is configured so that the user of the system 10 can change the adjustments 135, 137 using the graphical-user interface (GUI) display. In one embodiment, the changes can be made simply by touching the adjustment, or adjuster 135, 137 and making an appropriate gesture thereafter depending on the embodiment.

In some cases, the user, upon touching an adjuster 135, 137, will be presented with a slide, an enlarged dial, or other common mechanism for adjusting a setting, over which the user can move a finger or stylus to adjust the adjuster 135, 137. The system 10 can include other mechanisms for adjusting the adjusters 135, 137 without departing from the scope of the present invention.

The example adjustments 135 for the pre-amp 134 include a Treble adjustment, a Bass adjustment, and a Mid adjustment. The adjustment settings affect the manner by which the particular virtual pre-amplifier (i.e., the Ultra Clean amp 134 in the illustrated example) manipulates the tone.

The effect adjustments 137 likewise affect the manner by which the effect 136 manipulates the audio signal passing through the system 10. The example adjustments 137 shown in FIG. 5 are a Level, a Hall, and a Time.

The Time adjustment for the effect 136 controls an amount of time that the effect will be applied. For embodiments in which effects have a time setting, the effects are performed in a pre-determined order.

In one embodiment in which the audio features 134, 136 are arranged in the package-display area 122 vertically, as in FIG. 5, the playing signal moves vertically upward from the bottom, up through the effects. In another embodiment having a vertically-arranged package-display area 122, the tune flow can flow downward.

Any selected virtual pre-amplifier (e.g., pre-amp 134 in FIG. 5) or virtual cabinet (e.g., cab 232 in FIG. 11) operates to manipulate the signal passing through the system 10 throughout a performance, while any timed effect(s) come into play and stop.

It is possible to run two different effects together, and some fascinating sounds can be created in this way. The knobs shown in the example effects are merely for illustrative purposes and could be very the same, similar, slightly different, or markedly different in a particular implementation of the present technology.

It is contemplated that most effects will not have any sort of timing feature. The primary type of effects expected to have timing features are reverbs and delays. Controlling the timing in features like a reverb, e.g., allows a user to control how they want to associated note to be placed—e.g., if they want the effect to make the note played sound big, spaced out, stretched out for a longer time, short to merely accent what is being played, etc.

With a delay, a musician can, for instance, control tempo of a repeating sounds that comes after a note being played, which can be particularly useful if the musician is trying to control something specific for a song at a particular tempo. When done properly, a user can e.g., make a single guitar sound like two or three playing together. Running two or more delays and/or reverbs can create some very interesting soundscapes. Traditionally, such results were only possible, if at all, via manual setting of numerous hardware settings and pedals, which is tedious, costly, time consuming, and difficult to reproduce every time on multiple occasions. Under the present technology, virtual effects replace many hardware components that needed to be separately set and controlled.

Further according to the present technology, for use when a user is in a live performance—e.g., using the Stage mode described herein, timing of particular effects can be set in the effect itself for that particular tone. For example, a user may in connection with a desired clean tone use a reverb effect and, for the tone, may set it to sound big (reverb) and make the note last a long time (delay). The user may then make another tone but for this one, while using the same reverb effect, set a timing (delay) of it to be much shorter and smaller sounding, such as if the user just wanted to add some dimension to the sound without creating too much of an ambient result in the soundscape.

If any virtual effects are selected, their icons are positioned under any selected virtual cab and pre-amp. The Ice Reverb effect icon 136 is shown below the amp icon 134 in FIG. 5, for example.

The icons for various types of audio features can be distinguished at least in the package-display area 122 in ways other. These ways include by the relative vertical positioning scheme described above in connection with FIGS. 5, 8, and 11, and a similar horizontal scheme. Another approach includes relative positioning, vertical or horizontal, plus multiple columns or rows if needed to show more audio feature icons.

Another way to distinguish audio features, the icons for various types of audio features in the package-display area 122 can have pre-defined body color, body pattern, font, shapes, outline shape, outline pattern, outline color, or the like. For example, the icon for any selected virtual pre-amp can show in the package-display area 122 in the same format, and so will look generally the same except for a displayed name of the particular pre-amp(s) selected. Similar applies for effects, or types of effects—e.g., all effects will look similar, except for a displayed name of the particular effect(s) selected, or echo effects will look similar, except for the displayed name of the particular effect(s) selected.

A pre-established audio package can be configured by the user, according to user desire, to have one or more audio effects—via the audio effects icon 126. The pre-established audio package can also be configured, according to user desire, to have one or more pre-amplifiers—via the amplifier icon 128 of FIG. 5. Generally, users will want to include in a single audio package only one virtual cabinet—via cab icon 130, if any, but in one contemplated embodiment, the system 10 allows a user to include more than one.

The computer-executable instructions 56, e.g., the performance or stage module 76 thereof, are in some embodiments configured so that more than one tone feature of the same type—e.g., a pre-amp-type or an effect-type, of the pre-established audio package, can be applied against input audio at generally the same time, and one or more sequentially.

As described further below, the audio features can be assigned, by the system 10 or user of the system 10, to selectable parts of a virtual representation of a performance input device (or PID) such as a footboard. In one embodiment, the system 10 is connected to a hardware PID during operation (e.g., for a live performance—e.g., concert), and user selection of a selectable component of the PID at the PID effects a tone function at the system 10 that is pre-associated, by the user at the virtual PID, with the selected PID component. These operations are described further below, at least in connection with function of the bank and stage modules.

In a contemplated embodiment, the performance input device is a screen of the graphical-user-interface (GUI) display. The screen can, for example, resemble an actual footboard.

So with audio features assigned to selectable parts of the performance input device, such as expression pedals and buttons corresponding to an actual footboard or virtual footboard, the user can, by selecting the appropriate aspects of the performance input device, during performance, selectively call up the various audio features for affecting input performance audio—e.g., audio from a guitar, keyboard, bass, e-drums, or a microphone used by the user.

The GUI display is also configured so that the user can adjust the order of the effects of the audio package. In one embodiment, the user can do this simply by touching an icon and dragging across the system-user interface 14 to the desired location in the package-display area 122. In one embodiment, the tone feature indicators 134, 136 shown in the display area include a move indicator 139, such as a plus (+) symbol as shown in FIG. 5. In operation, the user touches the move indicator 139 and drags the tone feature to a desired new location.

VI.A. Tone Manipulation Component Overview

The software forming each tone feature can be referred to as an audio or manipulation component, an audio or tone modification part, or such descriptive term. The components are referred to primarily as tone manipulation components, or TMCs, herein.

The system 10, and particularly the computer-executable instructions 56, can be configured to accommodate various types of TMCs. Each TMC, whatever format, includes software for modifying input audio or tone in a pre-established desired manner. For example, an echo TMC provides an echo effect to incoming audio and outputs the audio now having the echo quality.

TMCs can be formatted, for example, according to any existing or to-be created sound-manipulating format or protocol. Example existing formats include those commonly referred to as plug-ins or plugins. Examples include the Virtual Studio Technology (or VST) format, created by the Steinberg company, the Audio Unit (AU) format, created by Apple, Inc., The Real Time AudioSuite (RTA) format, created by Digidesign company, DirectX, a registered trademark of the Microsoft Corporation, and Linux-based plug-ins such as Linux Audio Developers Simple Plugin API (LADSPA), Disposable Soft Synth Interface (DSSI), and LADSPA version 2 (LV2).

As described further below, the tone-manipulation components (TMCs) can be created by a designer of the system 10, a user of the system 10, or a third party developer. Each TMC is configured to modify audio in a desired manner. The manner may correspond to a manner by which a conventional hardware device would manipulate audio. For example, a TMC can be configured to yield output that is essentially the same as or highly-analogous to output that would result from a particular hardware device, such as a certain hardware pre-amplifier or effect rig.

By using TMCs providing audio-manipulation features corresponding to traditional hardware devices, the user is able to enjoy the sound benefits of the traditional devices without the associated costs, including financial, space, and weight costs. Use of TMCs also allows musicians to change the audio-manipulation features of their system 10 at will by making only a few selections at the user interface 14 and, again, without needing to purchase or rent, and handle (store, move, and position on stage), expensive hardware.

Figure 6:
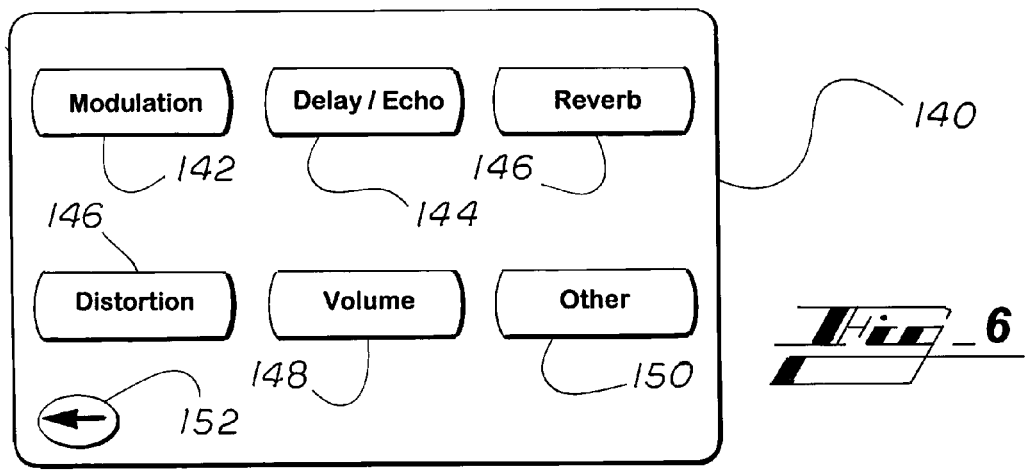

VI.B. Effect TMCs (FIGS. 6-8)

With continued reference to the figures, operations presented in connection with selection of the effects indicator or icon 126 of FIG. 5 are described in more detail. The effects icon 126 links the user to one or more possible audio-manipulating effects that the user can choose from.

The selectable effects linked to the icon 126 of FIG. 5 can be organized in categories, groups, or tiers, levels. FIG. 6, for instance, shows icons representing various types or groups of effects.

Example effects include distortion, reverb, delay, echo, delay/echo, volume, modulation, equalization (EQ), and others, such as sound splitter, crossfade, and step sequencer.

The groups of FIG. 6 include a Delay/Echo group. FIG. 7 shows multiple delay and echo effects that the user can select for inclusion in the audio package being constructed.

In the illustrated example, the effect selections available are distributed across multiple pages. A user can swipe through the pages via swipe gesture, as indicated by the multi-page indication 174. The display can instead include a next-page button, or the like for the user to use to switch to a next screen, and can likewise include a previous-page button.

In the present example, the user selects as a tone feature the "PsychoDelay" delay effect shown in FIG. 7. Responsive to the selection, the processor 52 receives a corresponding selection signal from the system-user interface 14. The processor 52 then, executing the computer-executable instructions 56, e.g., the lab module 72, adds the selected delay effect to the audio package being constructed or modified.

The processor 52 also then, executing the instructions 56, returns the screen view to the laboratory home screen 120. With the selected PsychoDelay effect having been added to the audio package, the effect is now shown by corresponding icon 182 in the package-display area 122 of FIG. 8.

The new icon 182 is shown in the display area 122 beneath the IceReverb effect icon 136 because the IceReverb effect was added earlier. Both effect icons 136, 182 are positioned beneath the amplifier icon 134 according to the convention described above whereby the selected pre-amp(s) is positioned in the display area 122 above any effects.

As shown in FIG. 8, the laboratory screen may also include a trash or trash bin 184. The location can also be referred to by similar names, such as a cancel bin, delete bin, etc. The system 10 can be configured to allow the user to move a tone feature from the audio package, being created or modified, to the trash bin 184 in ways like the icon-moving techniques described above.

VI.C. Pre-Amplifier TMCs (FIG. 9)

With continued reference to the figures, operations presented in connection with selection of the virtual pre-amplifier indicator or icon 128 of FIG. 5 are described in more detail. The virtual pre-amp icon 128 links the user to one or more available audio-manipulating virtual pre-amps.

The selectable pre-amps linked to the icon 128 of FIG. 5 can be organized in categories, groups, tiers, or levels. In the illustrated example, the amp selections are distributed across multiple pages. A user can swipe through the pages via swipe gesture, as indicated by the multi-page indication 202. The display can instead include a next-page button, or the like for the user to use to switch to a next screen, and can likewise include a previous-page button.

The pre-amp options in the amp-selection screen of FIG. 9 include those having example names Halo 192, The Commoner 194, High Class 196, Crown Royal 196, Lionheart 198, and The Spartan 200, The screen 190 can also include a back button 204, allowing a user to return to, e.g., the home screen 120 of the laboratory.

As provided, the virtual pre-amplifiers are in at least some cases configured to simulate the audio manipulation characteristic of a hardware pre-amplifier. Conventional professional-grade types of hardware pre-amplifiers include solid state and tube. Each conventional hardware pre-amplifier takes an input signal and adds a unique type of positive gain.

The virtual pre-amplifiers can also be configured to: (i) simulate the audio manipulation characteristics of a particular type or brand of a known hardware pre-amplifier, (ii) act as a modified version of such a pre-amplifier, or (iii) manipulate audio as a pre-amplifier that is notably distinct from available hardware pre-amplifiers.

As with conventional hardware pre-amplifiers, the virtual amp TMCs can be configured as desired to promote audio for certain types of audio or music. For instance, one virtual amp TMC can be designed to promote optimal sound for rock music, another for jazz music, another for alternative music, etc.

VI.D. Speaker Cabinet TMCs (FIGS. 10 and 11)

With continued reference to the figures, operations presented in connection with selection of the cabinet indicator or icon 130 of FIG. 5 are described in more detail. The cab icon 130 links the user to one or more possible audio-manipulating virtual cabinets that the user can choose from.

The selectable cabs linked to the icon 130 of FIG. 5 can be organized in categories, groups, tiers, or levels. The cab selection screen 210 of FIG. 10 does not include such breakdown because the six cabs available in this example configuration can show in the single view of FIG. 10.

Figure 10:
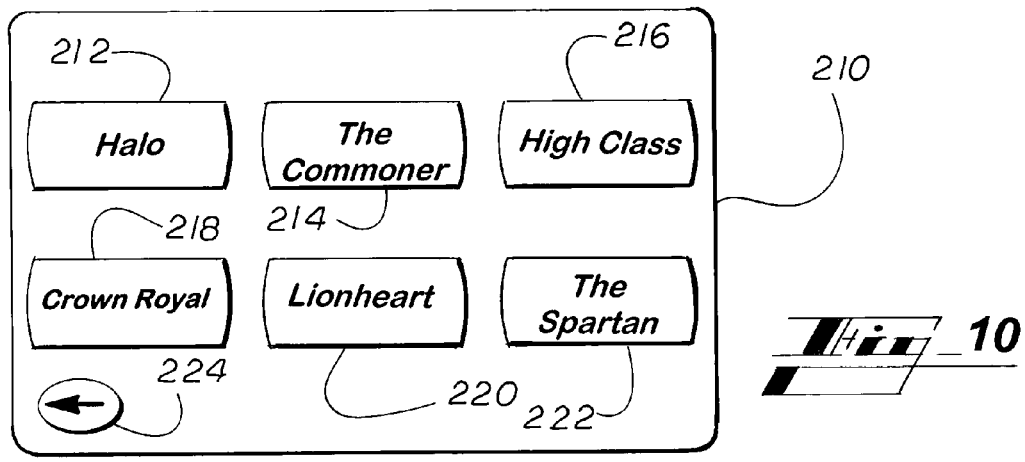
Figure 11:
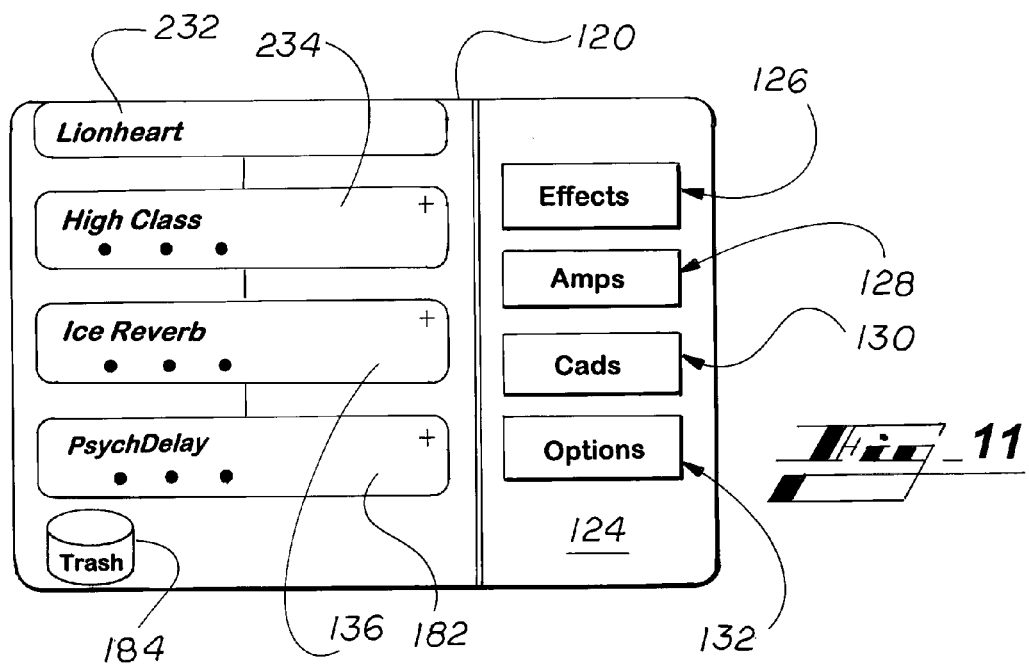

The cab options in the cab-selection screen of FIG. 10 include those having example names Halo 212, The Commoner 214, High Class 216, Crown Royal 218, Lionheart 220, and The Spartan 222. As can be seen, names of different features can have the same or similar names, such as a name of a cab and a name of an amp—in some implementations, a designer of the features may give them similar or the same names to indicate that they are related, can be used together, are recommended for use together, etc.

The screen 210 can also include a back button 224, allowing a user to return to, e.g., the home screen 120 of the laboratory.

A primary contemplated use of the virtual cab is to blanket the overall tone the user hears while testing out a pre-established audio package. The virtual cab may not be needed if the artist is running audio through their own rig. In one embodiment, a virtual cab selected only shows in the package-display area 122, and is applied against audio, during a construction phase, and is not stored as part of the package, and thus does not come up automatically upon selection of the package (or a bank including the package) for an actual live performance.

The virtual cab should be designed or selected to match the actual output speakers, which will receive system 10 output during live performance. In one embodiment, a single virtual cab is used for an entire pre-established audio package, or more broadly for an entire bank created, as described herein, which may include more than one pre-established audio package, for use in a performance because a user will most likely use only a single hardware output cabinet in the performance, Other benefits include simplifying system 10 usage and discouraging artists from affecting their tone negatively, such as by designing an audio package using headphones, or a different cabinet than those to be used in the performance, resulting in an eventual output sound that does not sound as desired when put through the actual cabinet.

The virtual cabinets can be created using pulse readings from real-world cabinets, such as a Marshall cabinet (Marshall is a registered trademark of Marshall Amplification Plc, of Buckinghamshire, UK). A virtual cabinet can also be created using such readings and tweaks to create a modified realistic cabinet, or can be created without such readings.

FIG. 11 shows the home screen 120 of the laboratory following selection of the Lionheart icon 220 for cabinet. The package-display area thus now includes the Lionheart cabinet 232. The cabinet 232 is shown at the very top, of the vertical configuration example being illustrated, according to the convention described above putting any selected cabinet at the very top.

VI.E. Laboratory Options (FIG. 12)

With continued reference to the figures, operations presented in connection with selection of the Options indicator or icon 132 of FIG. 5 are described in more detail. The Options icon 132 links the user to one or more administrative options that the user can choose from.

The options linked to the icon 132 of FIG. 5 can be organized in categories, groups, tiers, or levels. The options selection screen 240 of FIG. 12 does not include such groups as the four options available in this example configuration of the system 10 can show in the single view of FIG. 12.

Figure 12:
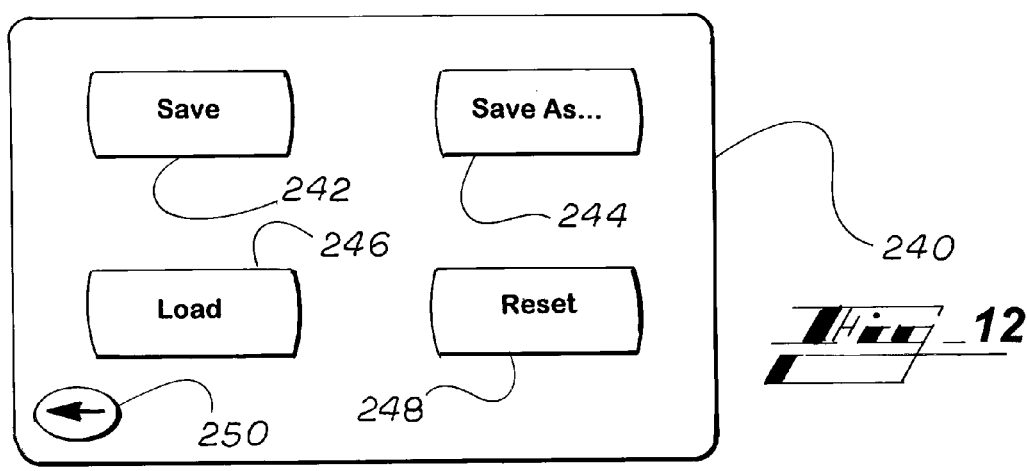

The Options of the example screen 240 of FIG. 12 include a save option 242, a save-as option 244, a load option 246, and a reset option 246. The save option allows a user to save for a first time a new pre-established audio package created, or if the package being worked on was previously saved, then selecting the option simply saves the revised package in place of the previous. The save-as option allows a user to create a new file, saving the present package as a new package, and so to assign a file name to the new package.

The load or open option 246 allows a user to open a previously-formed pre-established audio package.

The reset or clear option 248 allows a user to clear all previously-selected features of an open audio package, and so start from scratch in creating the package.

As shown in FIG. 12, the screen 240 can also include a back button 224, allowing a user to return to, e.g., the home screen 120 of the laboratory.

In one embodiment (not illustrated in detail), the GUI display includes mechanisms by which a user can delete a previously-created pre-established audio package (PEAP).

VII. The Bank (FIG. 13)

In response to receiving a signal from the system-user interface 14, such as in connection with display of the home screen 100, indicating that the bank or storage icon 104 was selected, the processor 52 proceeds to access the portion of the computer-executable instructions 56 corresponding to the laboratory functions—e.g., the bank module 74 and/or the GUI module 68.

As shown in FIG. 13, a home bank screen 251 can include a virtual representation of a performance input device (PID) 252, such as a virtual footboard, or foot controller. As described above, the virtual PID (e.g., virtual footboard) has components matching those of a hardware RID (e.g., hardware footboard) used by a user, such as a guitar player, to switch between tone features during performance. Alternatively, it is contemplated that a user can select amongst tone features from an on-screen 14 PID during performance.

The example footboard PID 252 includes expression pedals 254 and 256, and upper and lower buttons 258.

The screen 251 also shows various pre-established audio packages 260, 262, 264, 266. To program, or modify, a virtual RID in connection with a pre-established audio package, the user selects the audio package. As indicated by the multi-page display 268, a user can swipe between pages to find the desired pre-established audio package to work with. As provided above regarding other screens, these bank screens also can include other pagination or page turning mechanisms, such as next-page and previous-page buttons.

To associate pre-established audio packages with a part of the virtual PID, in one embodiment the user simply touches a selected package—e.g., Jazz Mirror 260 in FIG. 13—and drags it to the PID part, e.g., first top-row button 258. In a contemplated embodiment, the user taps the destination PID part or the desired audio package for the PID part, and then subsequently taps the other—i.e., the desired audio package or the destination PID part. Other mechanisms for associating a package and a PID part are possible without departing from the scope of the present amendment.

Expression PID parts, such as expression pedals of a footboard, can be used to implement select audio features of a select audio package. For audio features having expression capability, the adjusters showing in the package-display area 122 of the laboratory screen can include a corresponding adjustor, or adjuster—e.g., an adjuster for selecting left or right expression pedal 254, 256 of FIG. 13.

In addition to right/left adjusters on a tone feature icon in the package-display area, the user can select a PID location by dragging the feature to the target portion of the virtual PID. In one embodiment, the selection of which PID location is associated with a one can be made or modified in either way.

If more than one expressionable features (e.g., two or all of an echo, scratch, and a wah) are associated with an expression component, e.g., two or more expressionable features associated with a right expression pedal of a footboard, both features will be expressed responsive to the user selecting the expression component (e.g., right expression pedal) during the performance or stage mode.

VIII. The Stage (FIGS. 14 and 15)

In response to receiving a signal from the system-user interface 14, such as in connection with display of the home screen 100, indicating that the stage or performance or stage icon 106 was selected, the processor 52 proceeds to access the portion of the computer-executable instructions 56 corresponding to the laboratory functions—e.g., the performance or stage module 76 and/or the GUI module 68.

As referenced above, a display of the stage portion of the GUI display shows multiple banks or performance set-ups that the user can select from, as shown in the screen 300 of FIG. 14. The bank set-ups are identified in the example of FIG. 14 as Banks 1-4, at figure reference numerals 302, 304, 306, 308, although, as described, the banks could have user-created names, instead.

The screen also includes a pagination or multi-page indication 309 allowing the user to move to other pages of available banks to choose from.

The stage or performance screen 300 can also include a cabs icon 310, a back icon 312, a change order icon 314, and an options icon 316.

Via the cabs icon 310, a user can select a virtual speaker cabinet before selecting a bank. This could be useful, for example, if the user is using their own rig, or running their audio through a hardware power amplifier or headphones. In a contemplated embodiment, the user can select a cabinet as such after selecting the bank.

By the back icon 312, the user can choose to return to a previous screen, such as to the home screen 100 of FIG. 4.

By the Change Order icon, the software 56 allows the user to edit a selected bank. In one embodiment, this is accomplished in a laboratory-like environment of the stage portion of the GUI display. The laboratory-like environment could be implemented by the stage module 76, the laboratory module 72, and/or GUI module 68.

By the options icon 316, the software 56 can present a screen, like the screen 240 of FIG. 12, allowing the user to save any modified banks, either as a new bank or in place of the bank modified.

By selecting a bank icon, e.g., the Bank 1 icon 302 of FIG. 14, the software proceeds to a performance mode. In one embodiment, the default performance ode is a safe mode.

FIG. 15 shows a type of safe-mode screen 320. The screen 320 includes display of a virtual PID 322, in the form of a footboard. The screen 320 also indicates the pre-established audio packages associated with the PID parts. In the example of FIG. 15, a first pre-established package is shown associated with a first top-row icon 328, a second package associated with the second top icon 330, and similarly for icons 332, 334, 336, 338.

The view 320 also includes expression PID parts, implemented in this example as expression pedals 324, 326, as described above.

In a particular embodiment, the display 320 is default locked while the system is in the safe mode, and includes an unlock feature 338. The unlock feature can include a slide mechanism 340 over which the user makes a swipe gesture to pull the slide, or any other type of mechanism desired by a designer of the system 10.

If the user unlocks the safe screen 320, the user is presented with multiple subsequent options. These can include an option for the user to change banks, e.g., from Bank 1 to Bank 2 via a screen like the screen 30 of FIG. 14, and an option for the user to close out the session—e.g., return to the home screen 100 of FIG. 4, or exit the program altogether.

The options following the unlock can also include a power-down option. Such option can also be available at any of the screens described herein. It is also contemplated that the system 10 includes a power-up and power-down switch(es). In one embodiment, the power-down switch is not actionable while the system 10 is in the stage safe mode described above.

IX. The Tuner (FIG. 16)

In response to receiving a signal from the system-user interface 14, such as in connection with display of the home screen 100, indicating that the stage or tuner icon 108 was selected, the processor 52 proceeds to access the portion of the computer-executable instructions 56 corresponding to the laboratory functions—e.g., the tuner module 78 and/or the GUI module 68.

As an example, a guitarist may want to tune his top string to a certain keynote or pitch. The guitar is connected to the system 10. The user access the tuner screen 350 such as via the Tuner icon 108 of the home screen 100 of FIG. 3.

The user then plays the instrument part being tuned—e.g., plucks the top string of the guitar. The system 10 includes hardware and/or software interpreting the input instrument signal as an exact pitch. At a note-display area 356, the tuner screen 350, displays the pitch of the note received from the instrument. The note displayed in the example of FIG. 16 is A#.

If the note displayed, A# in FIG. 16, is far from the note pitch, e.g., E, then the user adjusts the instrument accordingly, and repeats. This can considered as a course adjustment.

If the note played is close to the target note, the note-display area 356 will display the target note, E in the example. For fine or precision tuning, a tone-detail area 354 shows how close the pitch from the instrument is to the target note. This proximity information can be communicated in various ways. In the illustrated example, the tone-range area 354 shows one type of meter format including an indicator 358 of the pitch played.

When the user plucks the string on the instrument, the metering display of the tone-detail area 354 will show how the pitch indicator 358 compares to the goal pitch. The user can pitch up or down as needed.

It is contemplated that a user may wish to be out of pitch by a certain degree. The tuning area of the program allows the user to easily set the instrument off pitch by the same certain degree on multiple occasions if desired.

The pitching process can be performed, advantageously, without the user having to effect any button, switch, etc. after entering the goal note.

X. The Market

In response to receiving a signal from the system-user interface 14, such as in connection with display of the home screen 100, indicating that the stage or market icon 110 was selected, the processor 52 proceeds to access the portion of the computer-executable instructions 56 corresponding to the laboratory functions—e.g., the market module 80 and/or the GUI module 68.

The market functions of the system 10 include connecting the computer sub-system 16 to one or more external databases of tone manipulation components (TMCs), such as plug-ins. In one embodiment, the software 56 is configured to cause the processor 52 to initiate connection to a remote database (e.g., associated with a remote server) via the internet or other wide-area computer network (WAN; not illustrated in detail).

In one embodiment, the software 56 allows the processor to connect to local-area networks (LAN). In one embodiment, the software 56 allows the processor 56 to access external TMCs via a removable memory or other external storage device, such as a laptop or desktop computer storing TMCs.

The system 10 can connect to communication networks via wired or wireless connection using the input/output interfaces 18, 24 described above in connection with FIG. 1. A primary source of market TMCs can be third party developers who make them available to users of the system 10. In one embodiment, an online marketplace is maintained to allow the users at least to download the market TMCs to their system 10.

The marketplace can be in many ways like digital conventional marketplaces in which desired software can be accessed by a user. Examples include Apple's iTunes or App Store (iTunes and App Store are registered trademarks of Apple, Inc., of Cupertino, Calif.). The marketplace can have categories or groupings, search features, a most-popular-downloads section, detailed descriptions, a sample function (analogous to a sample screen shot) allowing a user to sample a TMC before purchasing it, and other functions for helping users of the system 10 find the appropriate TMC(s) for them. Categories or groupings of the marketplace can match those of the system 10, such as those described above regarding pre-amps and effects.

Some or all of the market TMCs, whether available via the Marketplace, via WAN, etc., can be free or have a cost.

Guidelines or standards can be set for designers seeking to make TMCs available to the general public. The guidelines can relate to formats or protocols used in creating the TMC and quality standards such as regarding the robustness of the TMC applications being proposed. A primary goal and benefit of having guidelines is quality control.

In one embodiment, proposed market TMCs from designers must be approved, by the entity managing the marketplace, such as a maker and distributer of the system 10 or agent thereof.

The software 56 can be configured so that any user-selected market TMCs are added directly to a pre-established audio package (including to the package-display area 122) and/or added to the TMC options (e.g., the options of FIG. 7) for later selection by the user for inclusion in a pre-established audio package.

XI. The Preference Center

In response to receiving a signal from the system-user interface 14, such as in connection with display of the home screen 70, indicating that the preference or settings icon 112 was selected, the processor 52 proceeds to access the portion of the computer-executable instructions 56 corresponding to the laboratory functions—e.g., the market module 80 and/or the GUI module 68.

As described above, the computer-executable instructions 56 include code, such as the aforementioned information or help module 84, configured to provide information and/or help-related services to the user. As also provided, these services can be provided behind the preference or settings icon 112 or behind an information or help icon which can be added to the home screen 100 of FIG. 3.

The help information can include frequently-asked-questions, a link to a website of the maker or distributor of the system 10, and a contact-us information including, e.g., a phone number, mailing address, email address, a form for leaving an e-message, etc.

The preference information can include default settings, such as a setting to start every new pre-established audio package with a certain virtual pre-amplifier, formats for display, such as of display of the tone-display area 120—e.g., vertical disposition as shown in the figures, an alternative horizontal disposition, or other.

XII. Algorithms for Operation (FIGS. 17 and 18)

FIG. 17 shows a method 400 for the system 10, according to an algorithm thereof, forming or editing a pre-established audio package with user input, for subsequent use in a live performance.

Figure 18:
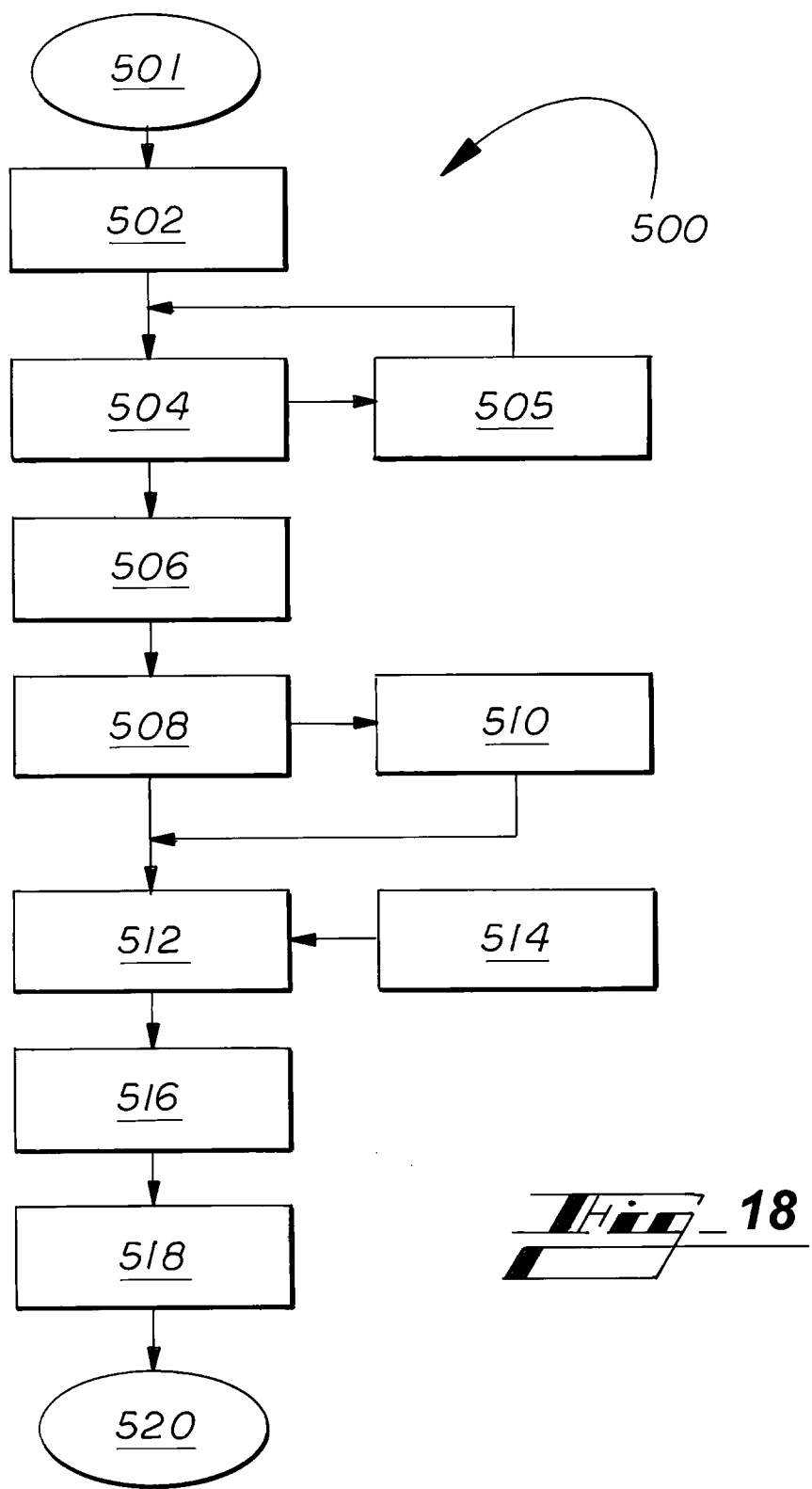
FIG. 18 illustrates a second example process algorithm.

FIG. 18 shows a method 500 for the system 10, according to an algorithm thereof, manipulating sound as part of a live performance. The methods of the present technology also include the algorithms and steps associated with managing the prepared audio packages, such as modifying or deleting a package, tuning an instrument, and the other operations described herein.

It should be understood that the steps of the methods 400, 500 are not necessarily presented in any particular order and that performance of some or all the steps in an alternative order is possible and is contemplated. And the methods are not necessarily mutually exclusive, as some or all operations of one can be included in the other.

The steps have been presented in the demonstrated order for ease of description and illustration. Steps can be added, omitted and/or performed simultaneously without departing from the scope of the appended claims. It should also be understood that the illustrated methods 400, 500 can be ended at any time.

In certain embodiments, some or all steps of this process, and/or substantially equivalent steps are performed by execution by one or more processors of computer-executable instructions stored or included on one or more computer-readable storage mediums or devices, such as those described herein.

The methods described below outlines various aspects of one or more algorithms underlying operations of the system 10 and associated marketplace. The operations include those described above and the descriptions above and below are complementary to each other. Teachings and details disclosed above can thus be read into the descriptions below, and vice versa.

XII.A. Method of Forming or Editing a Pre-Established Audio Package

The method 400 of FIG. 17 begins 401 and, at block 402, the system 10 enters a laboratory or lab mode. The algorithm of the computer-executable instructions causing the processor to perform the lab operations can be part of a laboratory or lab module 72 and/or a graphical-user-interface module 68, as described above.

The algorithm of the computer-executable instructions causes the processor to present a laboratory screen via a graphical-user-interface display and the user interface 14, such as the screen 120 of FIG. 5. The processor can do this upon start-up of the system 10 or in response to a user selection to enter the lab mode, such as a user selection of a laboratory mode—e.g., selection of lab icon 102 at screen 100 of FIG. 4.

The algorithm continues to block 404, whereat the processor executing the instructions receives input, via the interface 14, from a user for forming or editing a pre-established audio package. As described above, the input can include the user selecting from a screen, like the screen 120 of FIG. 5, the virtual effect icon 126, pre-amp icon 128, or cab icon 130, as described in further detail above in connection with FIGS. 5-11.

At block 406, responsive to the user input for addition of a certain type of tone feature, such as a virtual pre-amp, a virtual cab, or a TMC, the processor accesses instructions for managing and operating a corresponding feature-selection screen. For example, if the user selects effect icon 126, the processor displays a tone-manipulation component (TMC) option screen like the screen 140 of FIG. 6, or screen 160 of FIG. 7. Or if the user selects the pre-amp icon 128, the processor displays an amp-option screen like the screen 190 of FIG. 9. If the user selects the cab icon 130, the processor displays a cab-option screen like the screen 210 of FIG. 10.

Presentation of tone feature choices and receipt of user selection therefrom can also be made in connection with the market mode described above. The processor could effect these functions by executing the market module, the lab module, and/or the GUI module described herein. In doing so, the processor connects to the user to a market, such as an online marketplace available via a wide area network such as the internet. The market tone feature, such as a market TMC—e.g., plug-in, can also be retrieved from a local area network (LAN), removable storage device, or other.

The algorithm causes the processor to perform all operations described herein including the other detailed operations described above in connection with these screens, such as pagination, deleting a tone feature previously included in the package, etc.

At block 408, responsive to user selection of a tone feature at any of the appropriate screens, the processor adds the feature to the pre-established audio package and so to the representation of the package in the package-display area 122 (FIGS. 5, 8, 11).

The tone feature selected by the user can be added to the package-display area 122 according to a pre-set arrangement for displaying selected features, such as in a vertical arrangement wherein any selected virtual cabinet is presented vertically first at the top, any selected virtual amps are presented next vertically from the top, and effects (e.g., tone-manipulation components (TMCs) such as plug-ins) are added vertically below there.

Any of the operations of blocks 402, 404, 406, 408 can be repeated as desired by the user in connection with the formation or modification of the pre-established audio package, or in connection with forming a new pre-established audio package.

At block 410, upon completion of the formation or modification of a pre-established audio package, the user can be presented with and select an options icon 132 described above in connection with FIG. 5. In response, the processor presents options such as those of the example screen 240 of FIG. 12, including a save option 242, a save-as option 244, a load option 246, and a reset option 246. As provided above, the saving options can include saving one or more pre-established packages to a bank or performance set-up that is pulled up in the performance or stage mode described below in connection with FIG. 18.

The screen 240 can also include a back button 224, allowing a user to, e.g., return to the home screen 120 of the laboratory. These options presented and acted upon according to the algorithm are described in further detail above in connection with FIG. 12.

Block 412 represents the method ending or repeating.

XII.B. Method of Implementing Audio Package for a Live Performance

FIG. 18 shows a method 500 for using the system 10, in a stage or performance mode, for a live performance. The algorithm of the computer-executable instructions causing the processor to perform the lab operations can be part of a performance or stage module 76 and/or a graphical-user-interface module 68, as described above.

The method 500 begins 501 and, at block 502, the system 10 enters a performance or stage mode. The algorithm of the computer-executable instructions causes the processor to present a performance or stage screen via a GUI display and the user interface 14, such as the screen 300 of FIG. 14, or screen 320 of FIG. 15. The processor can do this upon start-up of the system 10 or in response to a user selection to enter the lab mode, such as a user selection of a laboratory mode—e.g., selection of stage icon 106 at screen 100 of FIG. 4, The algorithm continues to block 504, whereat the processor executing the instructions receives input from a user selecting bank previously associated with one or more pre-established packages, such as from the screen of FIG. 14. In a contemplated embodiment, the processor presents at least one pre-established audio package at block 502, such as at a screen like that of FIG. 14, but showing directly the pre-established package(s), and at block 504 receives user input selecting one or more of the pre-established packages presented directly.

The algorithm also includes ancillary options, represented by block 505, such as those associated with the additional options described above in connection with icons 310, 312, 314, 316 of FIG. 14.

At block 506, responsive to user selection of a bank or package(s), the processor enters a play mode, such as a safe play mode accompanied by a safe play mode screen like that of FIG. 15.

At block 508, an input signal is received from an audio device, such as a musical instrument or microphone. The signal is received via a wired or wireless interface of the system 10, such as the sound-input interfaces 18 described above in connection with FIG. 1.

If the input signal is an analog, flow proceeds to an analog-processing operation 510. The analog-processing operation 510 includes converting the analog signal to a digital signal for use in manipulating the resulting digital signal. The conversion can take place at a stand-alone analog-to-digital (A/D) converter 30 (ACD) that is separate from and connected to the computer sub-system 16 or which is a part of the computer sub-system 16, as hardware and/or software.

In one embodiment, the system 10 recognizes that the input signal is an analog signal based on the particular interface, e.g., wired socket, of the sound-input interfaces 18 the signal is received at.

Following conversion of the analog signal, flow of the method continues to block 512.

If the input signal received at block 508 is a digital signal, such as a MIDI signal, then flow can proceed directly to block 512.

At block 512, the processor applies the sound-manipulating features of the select pre-established audio package to the digital signal to form a manipulated output signal. The manipulation can include any manipulations described above, such as applying one or more virtual pre-amplifiers of the pre-established audio package to the signal, applying a virtual speaker cabinet, and applying TMCs such a plug-ins.

As shown in FIG. 18, the operation 512 of manipulating the signal can have as an input 514 such as user input. The input 514 can be received at a wired or wireless interface 21 (FIG. 1) from a performance input device (PID) such as a hardware footboard like the board 23 (FIG. 1). As also described above, the graphical-user-interface (GUI) display can present a virtual PID to the user and the input 514 can be received via the user interface 14 of the system 10 from the user.

At block 516, the processor outputs a manipulated signal. For cases in which analog output signal is needed, the manipulated signal can be converted at a digital-to-analog (D/A) converter (DAC), such as the DAC 31 shown in FIG. 1. Like the ADC, the DAC can be separate and connected to, or a part of, the computer sub-system 10, such as by being hardware and/or software component of the computer sub-system 10 or hardware and/or software connected to the computer sub-system 10.

At block 518, the manipulated-and-converted output (analog) signal is passed through a power amp 32 (FIG. 1). The amp 32 boosts, or adds gain, to the signal before the signal is provided to an output device 34 such as a speaker (e.g. single speaker or larger-scale audio or speaker system).

Block 520 represents the method ending or repeating.

XII.C. Other Methods

As provided, the software of the present system 10 is configured with algorithms corresponding with the other operations and particular screens described herein. These operations, and corresponding flow charts, are not shown for every function of the present technology.

The operations and screens including those associated with managing the prepared audio packages, such as modifying or deleting a package, and tuning an instrument.

XIII. Additional Features

In various embodiments, the system 10 of the present technology allows one or more features in addition to those described above including creating, modifying, managing, and using pre-established audio packages to enhance live performances.

The additional features include educational or training features, gaming features, and mixing, disc-jockey, or other recording-related features.

XIII.A. Educational Features

The system 10 can be configured to facilitate education such as music-related education. In one embodiment, the software 56 is configured to provide an educational, class, or classroom environment.

The class environment can present the user with target notes or total output sound. The class can be a so-called master class, with the target corresponding to an existing recording from a master musician, such as guitarist Joe Satriani, Carlos Santana, or Eric Clapton, or pianist Alicia Keys or Billy Joel. The target need not be from a master or popular musician, and could also include music and a voice or just a voice, such as a target speaking or singing voice.

Matching the target can include skill in hitting target notes. Matching the target can also include matching an overall sound, which is affected by how the user creates or edits a pre-established audio package.

In one embodiment, the system 10 advises the user how far or near their performance, which can include construction of the audio package, was to the target. In a contemplated embodiment, the system 10 can also provide instructional information to the user, such as advice about how they can change the created package to better match the target.

The system 10 can also provide training or tutorial data to the user, such as in the form of text, video, example audio packages, and/or other formats.

As provided the system 10 would communicate to the user how close their performance was to the target. In one implementation, the communication can resemble the tuning format of FIG. 16. The format for instance, can include some sort of alphanumeric feedback, such as the note or pitch achieved versus the target, a grade or score, point total, prize, aware, and/or others, graphical or meter-like feedback such as that described above in connection with FIG. 16, etc.

For the educational uses, the system 10 could include additional hardware such as additional wire or wireless-based connection points, switches, etc., as needed.

XIII.B. Gaming Features

The gaming features can be like the educational features in many ways, and can include any of the features described in the preceding section and vice versa.

For example, the system 10 can be configured to present a target or benchmark and the closeness of a user performance to the benchmark. The system 10 can further provide a corresponding score or ranking. The user can thus compete against themself, trying to obtain a better score or ranking in each performance.

In one embodiment, the system is configured to allow the user(s) to be in a virtual rendition of a real-world band, such as their favorite rock band.

XIII.C. Recording Features

The system 10 can act as a virtual sound board, mixing console, mobile recording studio, or the like. Regarding the sound board usage, a user, such as a live-audio engineer, can use the system 10 as both a power amp and a mixing board.

Regarding mixing and recording, a user such as a disc jockey (DJ) or electronica artist can use the system 10 to create high-quality recordings without high-cost instruments.

Another benefit is that recordings can be made for different instruments at different times, and the parts combined later by the system 10 and/or otherwise. The user can use the same or different banks or pre-established audio packages, whether in the same or different banks, for the different instrument parts.

Relevant to at least the mobility aspect, the system 10 can include all connections needed allowing the system 10 to receive input from a wide variety of contemplated instruments, microphones, that a user is likely to or may encounter. The connections can include wired and wireless connections, and can include those described above and/or other appropriate connections.

Typically, a recording studio consists of a computer, a digital audio workstation (DAW), an audio input/output interface, a high-end sound card, a mixing board, speaker monitors, and many other tools. According to the present technology, any of these tools are advantageously and novelly combined into an apparatus allowing a user to m manage everything from a touchscreen, and plug in whatever instruments the user desires. The touchscreen allows the user to divide each song project into different phases (e.g., recording phase, mixing phase, and mastering phase) so the user does not have to deal with a massive array of buttons, etc., that are not all needed at once in any event. The improvement is great, even over just the automation of conventional DAWs, the onscreen displays and options of which are crowded and all but bewildering for most all musicians.

XIV. Conclusion

Various embodiments of the present disclosure are disclosed herein. The disclosed embodiments are merely examples that may be embodied in various and alternative forms, and combinations thereof.

The law does not require and it is economically prohibitive to illustrate and teach every possible embodiment of the present claims. Hence, the above-described embodiments are merely exemplary illustrations of implementations set forth for a clear understanding of the principles of the disclosure. Variations, modifications, and combinations may be made to the above-described embodiments without departing from the scope of the claims. All such variations, modifications, and combinations are included herein by the scope of this disclosure and the following claims.

What is claimed is:

1. A non-transitory computer-readable storage device comprising computer-executable instructions being configured to process signals from a performance-input hardware device and comprising a laboratory module that, when executed by a computer processor, causes the computer processor to perform lab operations comprising:

presenting, via a graphical-user-interface (GUI) display, first visual information including a virtual performance-input component comprising a plurality of virtual selectors and a virtual expression part with positioning within the virtual performance-input component corresponding respectively to positioning of selector hardware components and an expression hardware component within the performance-input hardware device;

receiving a first user input for associating a particular one of the virtual selectors to a pre-established audio package;

receiving a second user input for associating the virtual expression part to an expressible tone feature of the pre-established audio package;

associating the pre-established audio package to the particular virtual selector in response to the first user input; and associating the expressible tone feature to the virtual expression part in response to the second user input.

2. The non-transitory computer-readable storage device of claim 1, wherein the expressible tone feature is configured to affect expression of a particular tone-manipulation component selected from a group consisting of:

an effect type;
a pre-amplifier type; and
a cabinet tone type.

3. The non-transitory computer-readable storage device of claim 1 wherein:

the computer-executable instructions comprise a GUI module that, when executed by the computer processor, causes the computer processor to perform user-interface operations comprising:

presenting, via the GUI display, second visual information indicating a laboratory link corresponding to the laboratory module and a live-performance link corresponding to a stage module; and receiving third user input indicating selection of the laboratory link; and the laboratory operation of presenting the first visual information including the virtual performance-input component is performed in response to the third user input.

4. The non-transitory computer-readable storage device of claim 1 wherein the computer-executable instructions comprise a stage module that, when executed by the computer processor, causes the computer processor to perform live-performance operations comprising:

receiving, from the performance-input hardware device, third user input indicating the pre-established audio package, wherein the third user input is initiated at the performance-input hardware device in response to user actuation of a particular one of the selector hardware components corresponding to the particular virtual selector;

receiving a live audio signal; and manipulating, in response to the third user input from the performance-input hardware device, the live audio signal using the pre-established audio package, yielding manipulated live audio signal.

5. The non-transitory computer-readable storage device of claim 4 wherein:

the live-performance operations further comprise presenting, via the GUI display, second visual information indicating a link to the pre-established audio package; and the live-performance operation of receiving the third user input is performed following presentation of the second visual information and the third user input selects the link to the pre-established audio package.

6. The non-transitory computer-readable storage device of claim 5 wherein:

the computer-executable instructions comprise a GUI module that, when executed by the computer processor, causes the computer processor to perform user-interface operations comprising:

presenting, via the GUI display, third visual information indicating a laboratory link, corresponding to the laboratory module, and a live-performance link corresponding to a stage module; and receiving fourth user input indicating the live-performance link; and the live-performance operation of presenting the second visual information is performed in response to the fourth user input.

7. The non-transitory computer-readable storage device of claim 4 wherein:

the live-performance operations further comprise receiving, from the performance-input hardware device fourth user input indicating the expressible tone feature, wherein the fourth user input is initiated at the performance-input hardware device in response to user actuation of the expression hardware component; and the live-performance operation of manipulating the live audio signal is performed using, in response to the fourth user input from the performance-input hardware device, the expressible tone feature, yielding the manipulated live audio signal.

8. The non-transitory computer-readable storage device of claim 7 wherein:

the live-performance operations further comprise presenting, via the GUI display, second visual information indicating a link to the expressible tone feature of the pre-established audio package; and the live-performance operation of receiving the fourth user input is performed following presentation of the second visual information and the fourth user input selects the link to the expressible tone feature.

9. The non-transitory computer-readable storage device of claim 7 wherein:

the expressible tone feature is a first expressible tone feature;

the lab operations further comprise:

receiving fifth user input associating the virtual expression part to a second expressible tone feature of the pre-established audio package; and associating, in response to the fifth user input, the second expressible tone feature to the virtual expression part; and the live-performance operation of manipulating the live audio signal is performed using, in response to the fourth user input, the first expressible tone feature and the second expressible tone feature.

10. The non-transitory computer-readable storage device of claim 1 wherein:

the virtual expression part and the expression hardware component are a first virtual expression part and a first expression hardware component, respectively; and the lab operation of presenting the first visual information comprises presenting the virtual performance-input component comprising the first virtual expression part and a second virtual expression part positioned within the virtual performance-input component corresponding respectively to positioning of the first expression hardware component and a second expression hardware component within the performance-input hardware device.

11. A non-transitory computer-readable storage device comprising computer-executable instructions being configured to process signals from a performance-input hardware device and comprising a stage module that, when executed by a computer processor, causes the computer processor to perform live-performance operations comprising:

maintaining a first association, between a particular virtual selector, of a plurality of virtual selectors, of a virtual performance-input component and a pre-established audio package stored at the computer-readable storage device;

maintaining a second association, between a virtual expression part of the virtual performance-input component and an expressible tone feature of the pre-established audio package;

receiving, from the performance-input hardware device, first user input indicating the pre-established audio package, wherein the first user input is initiated at the performance-input hardware device in response to user actuation of a particular one of a plurality of selector hardware components corresponding to the particular virtual selector which is in turn associated with the pre-established audio package;

receiving a live audio signal; and manipulating, in response to the first user input from the performance-input hardware device, the live audio signal using the pre-established audio package, yielding manipulated live audio signal.

12. The non-transitory computer-readable storage device of claim 11 wherein:

the live-performance operations further comprise presenting, via a graphical-user-interface (GUI) display, first visual information indicating a link to the pre-established audio package; and the live-performance operation of receiving the first user input is performed following presentation of the first visual information and the first user input selects the link to the pre-established audio package.

13. The non-transitory computer-readable storage device of claim 12 wherein:

the computer-executable instructions comprise a GUI module that, when executed by the computer processor, causes the computer processor to perform user-interface operations comprising:

presenting, via the GUI display, second visual information indicating a laboratory link, corresponding to the laboratory module, and a live-performance link corresponding to a stage module; and receiving second user input indicating the live-performance link; and the live-performance operation of presenting the first visual information is performed in response to the second user input.

14. The non-transitory computer-readable storage device of claim 11 wherein:

the live-performance operations further comprise receiving, from the performance-input hardware device, second user input indicating the expressible tone feature, wherein the second user input is initiated at the performance-input hardware device in response to user actuation of an expression hardware component of the performance-input hardware device; and the live-performance operation of manipulating the live audio signal is performed using, in response to the second user input from the performance-input hardware device, the expressible tone feature, yielding the manipulated live audio signal.

15. The non-transitory computer-readable storage device of claim 14 wherein:

the live-performance operations further comprise presenting, via the GUI display, first visual information indicating a link to the expressible tone feature of the pre-established audio package; and the live-performance operation of receiving the third user input is performed following presentation of the first visual information and the third user input selects the link to the expressible tone feature.

16. The non-transitory computer-readable storage device of claim 14 wherein:
- the expressible tone feature is a first expressible tone feature;
- the first expressible tone feature and a second expressible tone feature are associated in the computer-readable storage device with the virtual expression part; and
- the live-performance operation of manipulating the live audio signal is performed using, in response to the second input, the first expressible tone feature and the second expressible tone feature.

17. A non-transitory computer-readable storage device comprising computer-executable instructions being configured to process signals from a performance-input hardware device and comprising a market module that, when executed by a computer processor, causes the computer processor to perform market operations comprising:
- receiving, from a remote source by way of an Internet, a file including a virtual performance-input component comprising a plurality of virtual selectors and a virtual expression part, wherein:
  - the plurality of virtual selectors and the virtual expression part are positioned within the virtual performance-input component in a manner corresponding respectively to positioning of selector hardware components and an expression hardware component within the performance-input hardware device;
  - a particular one of the virtual selectors is associated with a pre-established audio package; and
  - the virtual expression part is associated with an expressible tone feature of the pre-established audio package.

18. The non-transitory computer-readable storage device of claim 17 further comprising a stage module that, when executed by a computer processor, causes the computer processor to perform live-performance operations comprising:
- receiving, from the performance-input hardware device, first user input indicating the pre-established audio package, wherein the first user input is initiated at the performance-input hardware device in response to user actuation of a particular one of the plurality of selector hardware components corresponding to the particular virtual selector.

19. The non-transitory computer-readable storage device of claim 18, wherein the live-performance operations further comprise:
- receiving a live audio signal; and
- manipulating, in response to the first user input from the performance-input hardware device, the live audio signal using the pre-established audio package, yielding manipulated live audio signal.

20. The non-transitory computer-readable storage device of claim 18 wherein:
- the live-performance operations further comprise presenting, via a graphical-user-interface (GUI) display, first visual information indicating a link to the pre-established audio package; and
- the live-performance operation of receiving the first user input is performed following presentation of the first visual information and the first user input selects the link to the pre-established audio package.

* * * * *